US011081497B2

(12) United States Patent
Surthi et al.

(10) Patent No.: US 11,081,497 B2
(45) Date of Patent: Aug. 3, 2021

(54) INTEGRATED ASSEMBLIES HAVING VERTICALLY-SPACED CHANNEL MATERIAL SEGMENTS, AND METHODS OF FORMING INTEGRATED ASSEMBLIES

(71) Applicant: Micron Technology, Inc., Boise, ID (US)

(72) Inventors: Shyam Surthi, Boise, ID (US); Richard J. Hill, Boise, ID (US); Byeung Chul Kim, Boise, ID (US); Akira Goda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/547,885

(22) Filed: Aug. 22, 2019

(65) Prior Publication Data
US 2021/0057434 A1 Feb. 25, 2021

(51) Int. Cl.
*H01L 27/11556* (2017.01)
*H01L 27/11582* (2017.01)
*H01L 29/51* (2006.01)
*H01L 29/792* (2006.01)
*H01L 21/28* (2006.01)
*H01L 29/49* (2006.01)
*H01L 29/788* (2006.01)

(52) U.S. Cl.
CPC .. *H01L 27/11582* (2013.01); *H01L 27/11556* (2013.01); *H01L 29/40114* (2019.08); *H01L 29/40117* (2019.08); *H01L 29/4991* (2013.01); *H01L 29/513* (2013.01); *H01L 29/517* (2013.01); *H01L 29/7883* (2013.01); *H01L 29/792* (2013.01)

(58) Field of Classification Search
None
See application file for complete search history.

(56) References Cited

U.S. PATENT DOCUMENTS

| 10,777,576 | B1 | 9/2020 | Kim et al. | |
| 2018/0219017 | A1* | 8/2018 | Goda | H01L 27/11582 |
| 2018/0219021 | A1* | 8/2018 | Daycock | H01L 29/7926 |
| 2020/0373322 | A1 | 11/2020 | Surthi et al. | |
| 2020/0388627 | A1* | 12/2020 | Hopkins | H01L 27/11565 |

* cited by examiner

*Primary Examiner* — Daniel Whalen
(74) *Attorney, Agent, or Firm* — Wells St. John P.S.

(57) ABSTRACT

Some embodiments include a NAND memory array having a vertical stack of alternating insulative levels and conductive levels. The conductive levels include control gate regions and second regions proximate to the control gate regions. High-k dielectric material wraps around ends of the control gate regions, and is not along the second regions. Charge-blocking material is adjacent to the high-k dielectric material. Charge-storage material is adjacent to the charge-blocking material. The charge-storage material is configured as segments which are vertically stacked one atop another, and which are vertically spaced from one another by gaps. Gate-dielectric material is adjacent to the charge-storage material. Channel material extends vertically along the stack and is adjacent to the gate-dielectric material. Some embodiments include integrated assemblies, and methods of forming integrated assemblies.

30 Claims, 27 Drawing Sheets

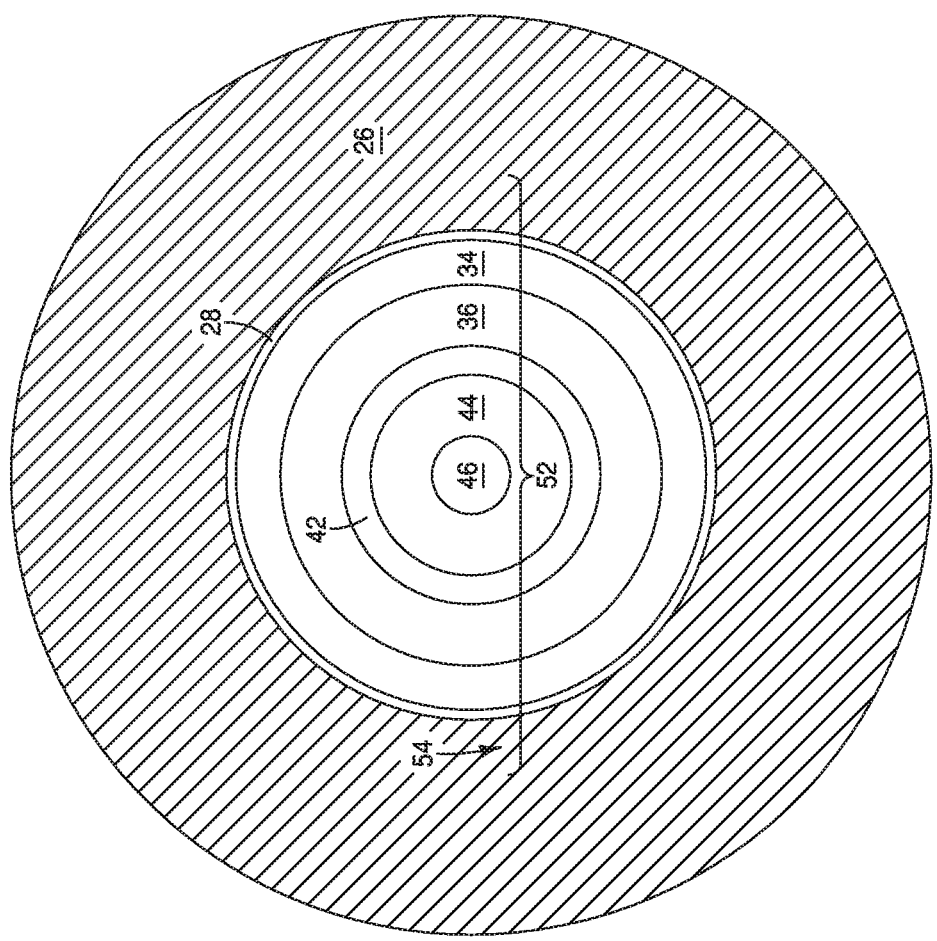

INTEGRATED ASSEMBLIES HAVING VERTICALLY-SPACED CHANNEL MATERIAL SEGMENTS, AND METHODS OF FORMING INTEGRATED ASSEMBLIES

TECHNICAL FIELD

Integrated assemblies (e.g., integrated NAND memory) having vertically-spaced channel material segments, and methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a block diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line)

350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture and improved methods for fabricating NAND architecture.

BRIEF DESCRIPTION OF THE DRAWINGS

FIG. 18A is a diagrammatic top view of a portion of the integrated assembly of FIG. 18.

DETAILED DESCRIPTION OF THE ILLUSTRATED EMBODIMENTS

Operation of NAND memory cells comprises movement of charge between a channel material and a charge-storage material. For instance, programming of a NAND memory cell may comprise moving charge (i.e., electrons) from the channel material into the charge-storage material, and then storing the charge within the charge-storage material. Erasing of the NAND memory cell may comprise moving holes into the charge-storage material to recombine with the electrons stored in the charge-storage material, and to thereby release charge from the charge-storage material. The charge-storage material may comprise charge-trapping material (for instance, silicon nitride, metal dots, etc.). A problem with conventional NAND can be that charge-trapping material extends across multiple memory cells of a memory array, and such can lead to charge migration from one memory cell to another. The charge migration may lead to data retention problems. Some embodiments include NAND architectures having breaks in the charge-trapping material in regions between memory cells; and such breaks may impede migration of charge between memory cells. Example embodiments are described with reference to FIGS. 5-26.

Figure 1:
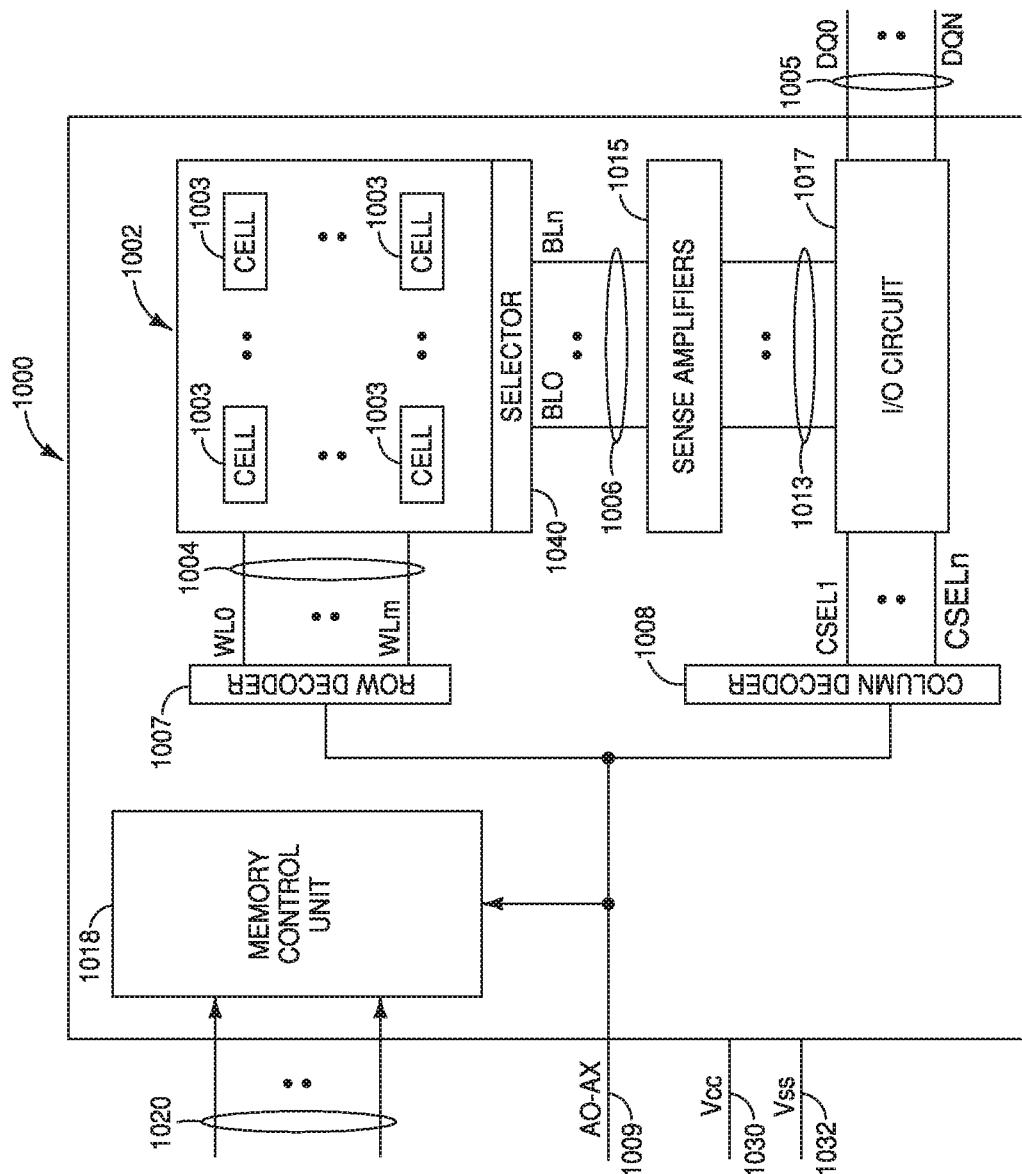
FIG. 1 shows a block diagram of a prior art memory device having a memory array with memory cells.
Figure 2:
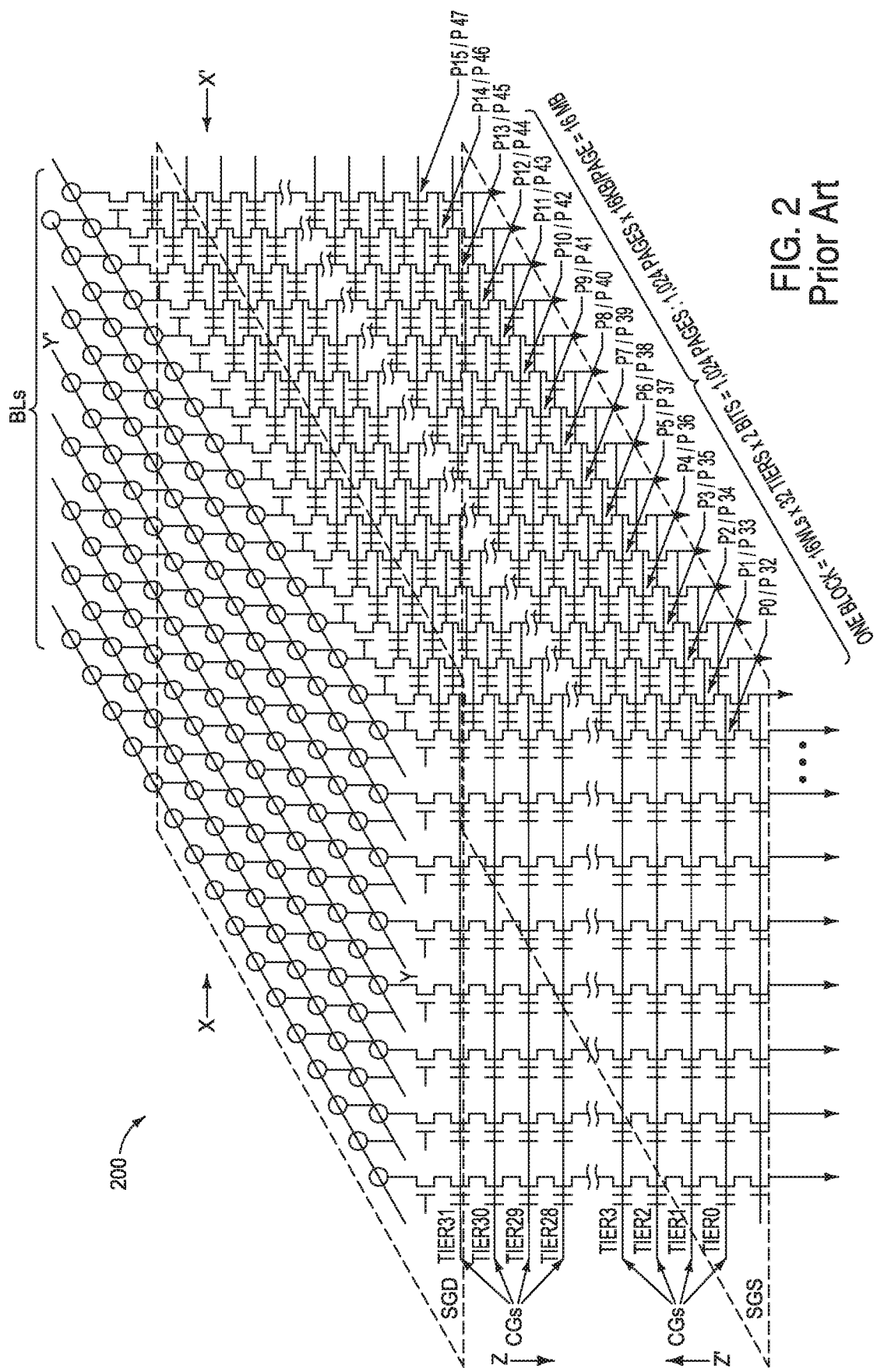
FIG. 2 shows a schematic diagram of the prior art memory array of FIG. 1 in the form of a 3D NAND memory device.
Figure 3:
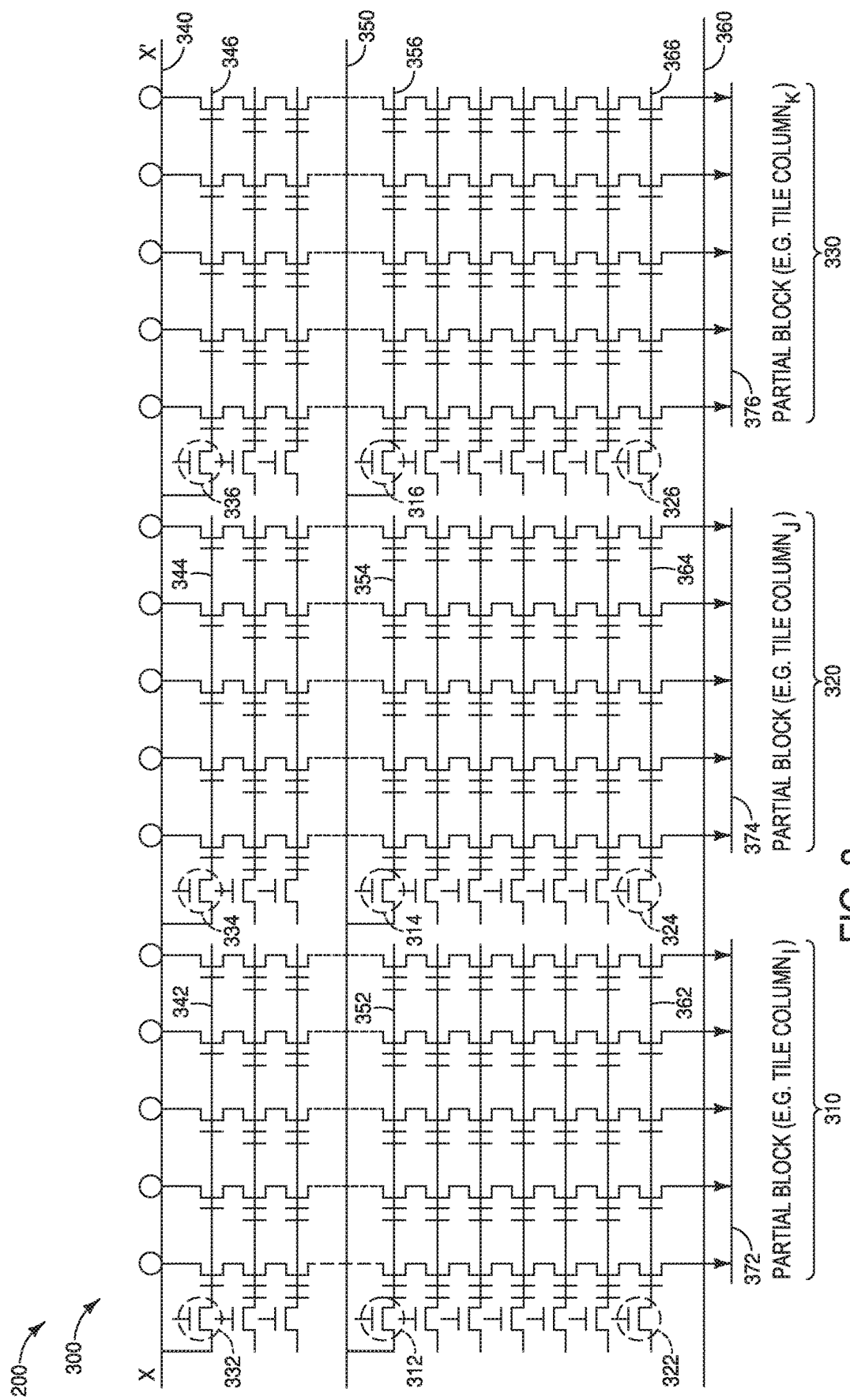
FIG. 3 shows a cross-sectional view of the prior art 3D NAND memory device of FIG. 2 in an X-X' direction.
Figure 4:
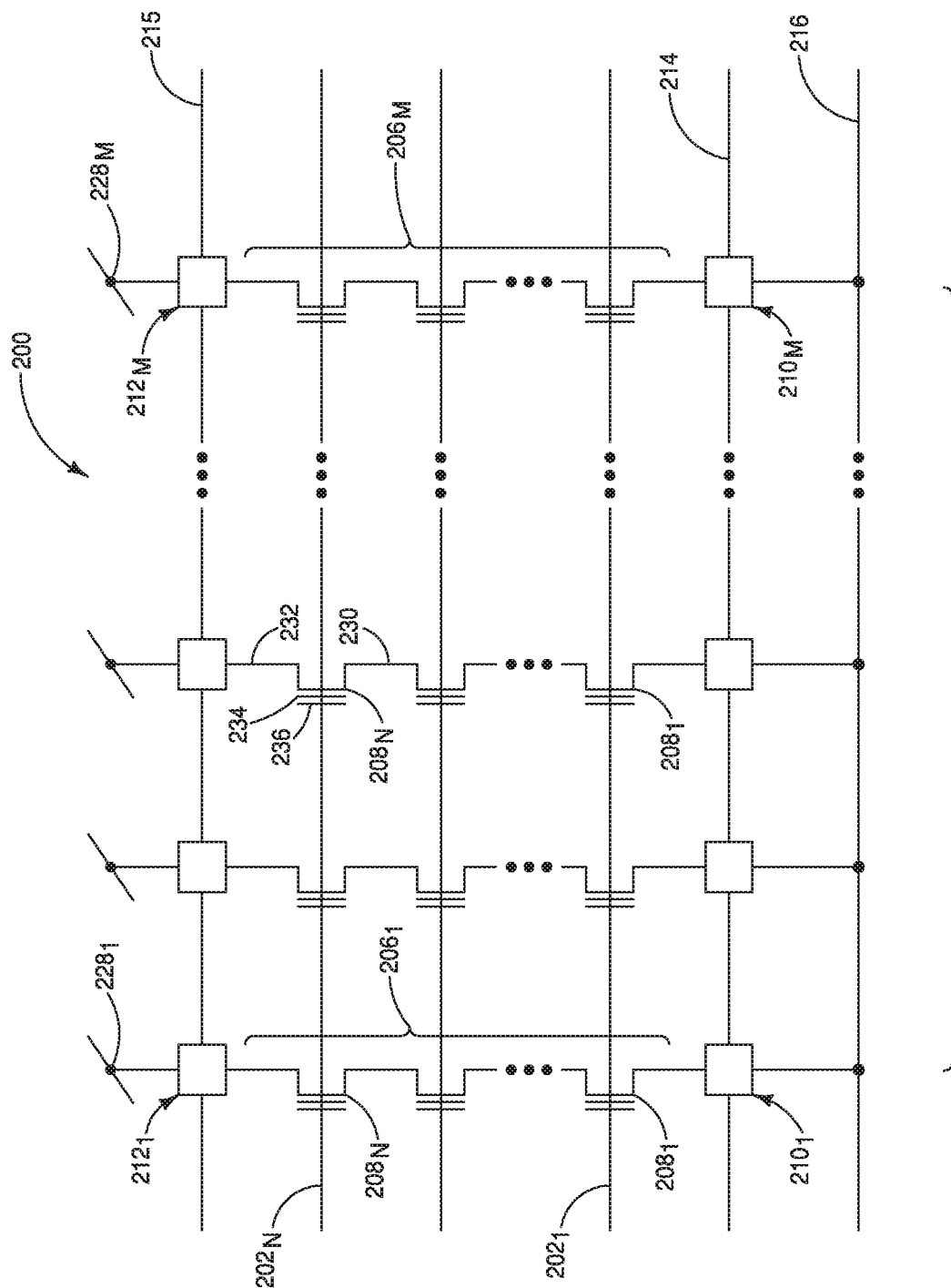
FIG. 4 is a schematic diagram of a prior art NAND memory array.
Figure 5:
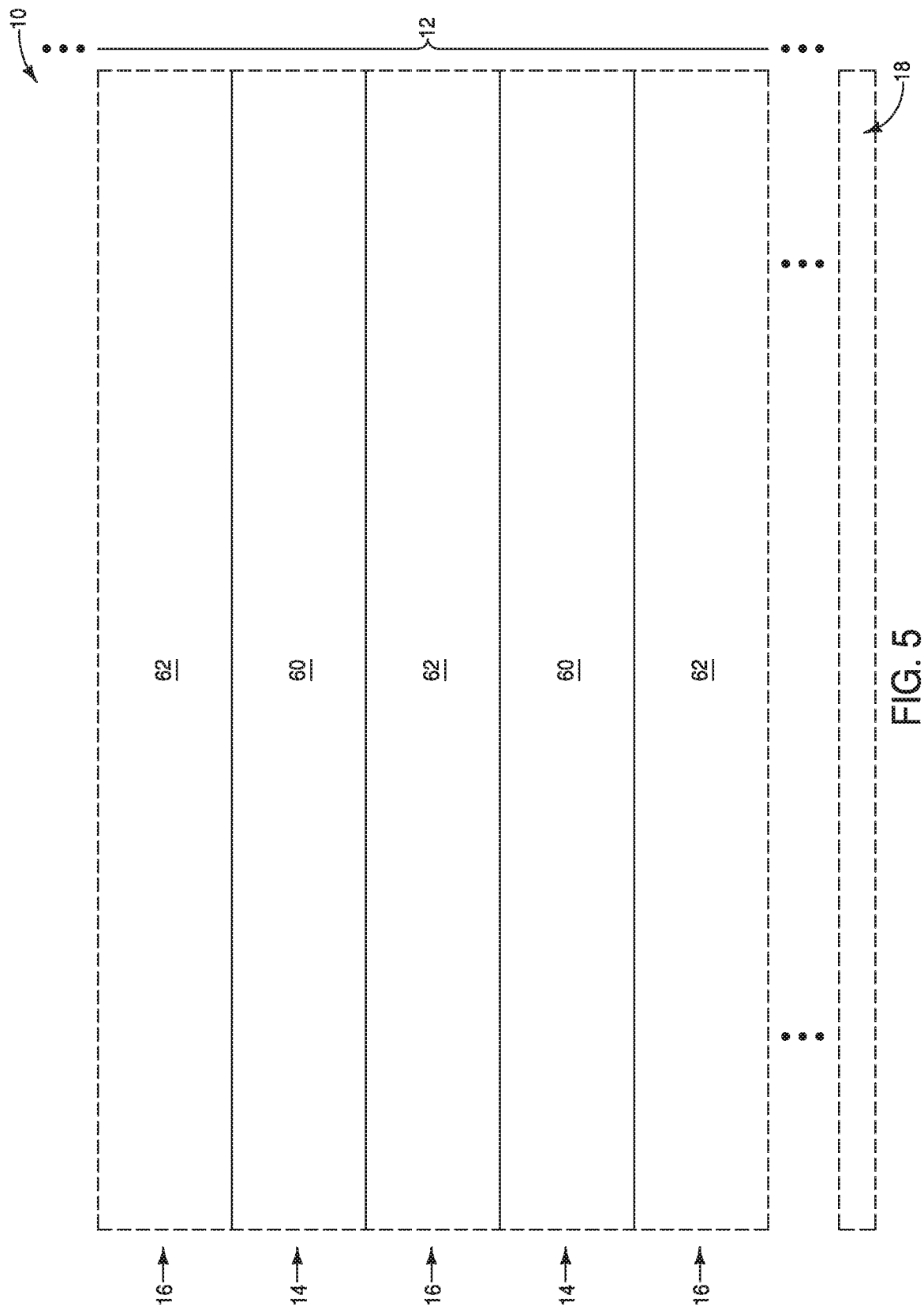
FIGS. 5-18 are diagrammatic cross-sectional side views of a region of an integrated assembly shown at example sequential process stages of an example method for forming an example NAND memory array.

Referring to FIG. 5, a construction (integrated assembly, integrated structure) 10 includes a vertical stack 12 of alternating first and second levels 14 and 16. The first levels 14 comprise a first material 60, and the second levels 16 comprise a second material 62. The first and second materials may comprise any suitable compositions, and are of different compositions relative to one another. In some embodiments, the first material 60 may comprise, consist essentially of, or consist of silicon dioxide; and the second material 62 may comprise, consist essentially of, or consist of silicon nitride. The levels 14 and 16 may be of any suitable thicknesses; and may be the same thickness as one another, or may be different thicknesses relative to one another. In some embodiments, the levels 14 and 16 may have vertical thicknesses within a range of from about 10 nanometers (nm) to about 400 nm. In some embodiments, the levels 14 and 16 may have thicknesses within a range of from about 10 nm to about 50 nm.

The stack 12 is shown to be supported over a base 18. The base 18 may comprise semiconductor material; and may, for example, comprise, consist essentially of, or consist of monocrystalline silicon. The base 18 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 18 may correspond to a semiconductor substrate containing one or more materials associated with integrated circuit fabrication. Such materials may include, for example, one or more of refractory metal materials, barrier materials, diffusion materials, insulator materials, etc.

A gap is provided between the stack 12 and the base 18 to indicate that other components and materials may be provided between the stack 12 and the base 18. Such other components and materials may comprise additional levels of the stack, a source line level, source-side select gates (SGSs), etc.

Figure 6:
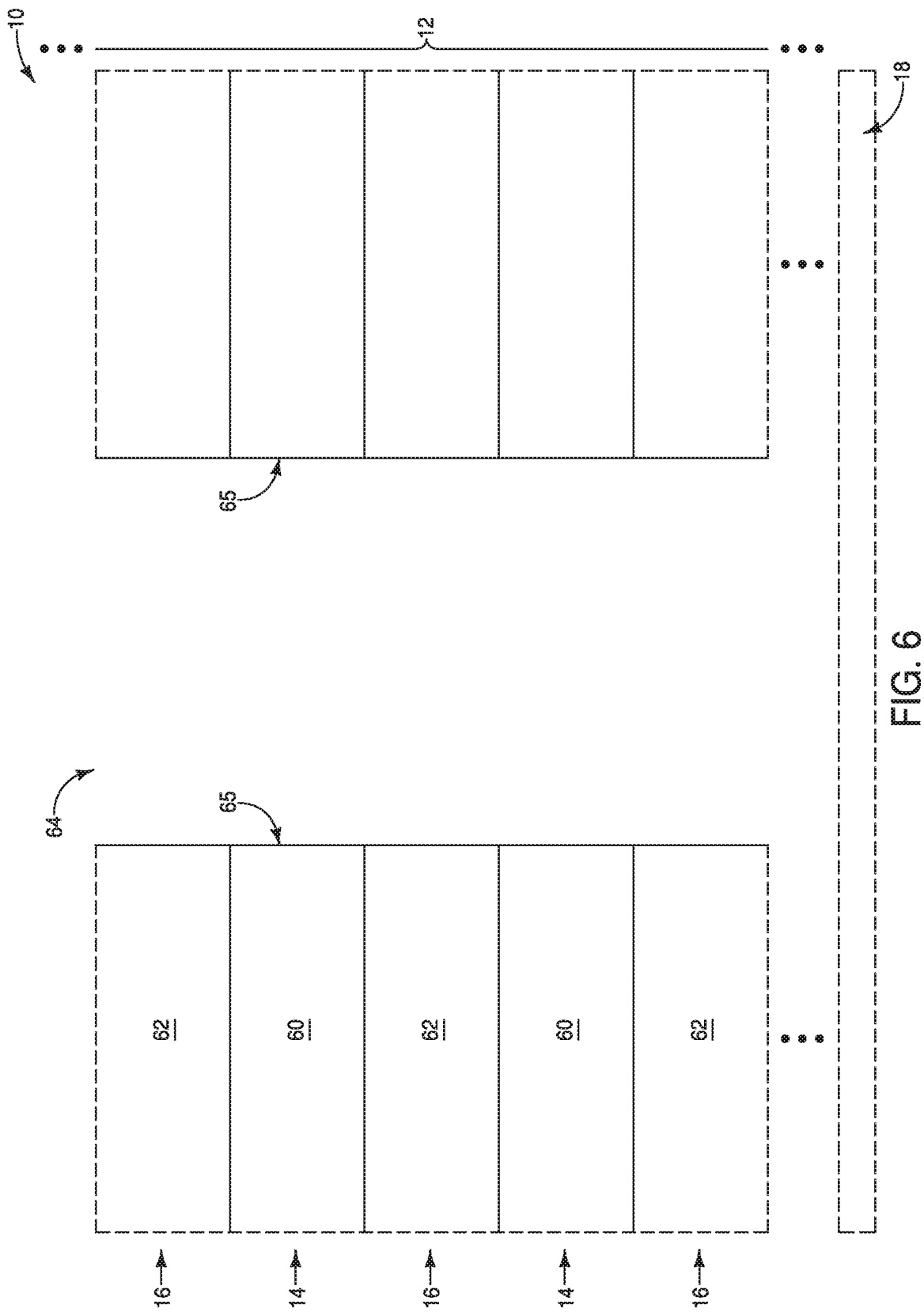

Referring to FIG. 6, an opening 64 is formed to extend through the stack 12. The opening 64 has sidewalls 65 extending along the first and second materials 60 and 62. The opening 64 may have a closed shape (circular, elliptical, polygonal, etc.) when viewed from above, and the sidewalls 65 shown in the cross-section of FIG. 6 may be part of a single continuous sidewall that extends around the closed shape of the opening 64. The opening 64 may be representative of a large number of substantially identical openings formed at the process stage of FIG. 6 and utilized for fabricating NAND memory cells of a NAND memory array. The term "substantially identical" means identical to within reasonable tolerances of fabrication and measurement.

Figure 7:
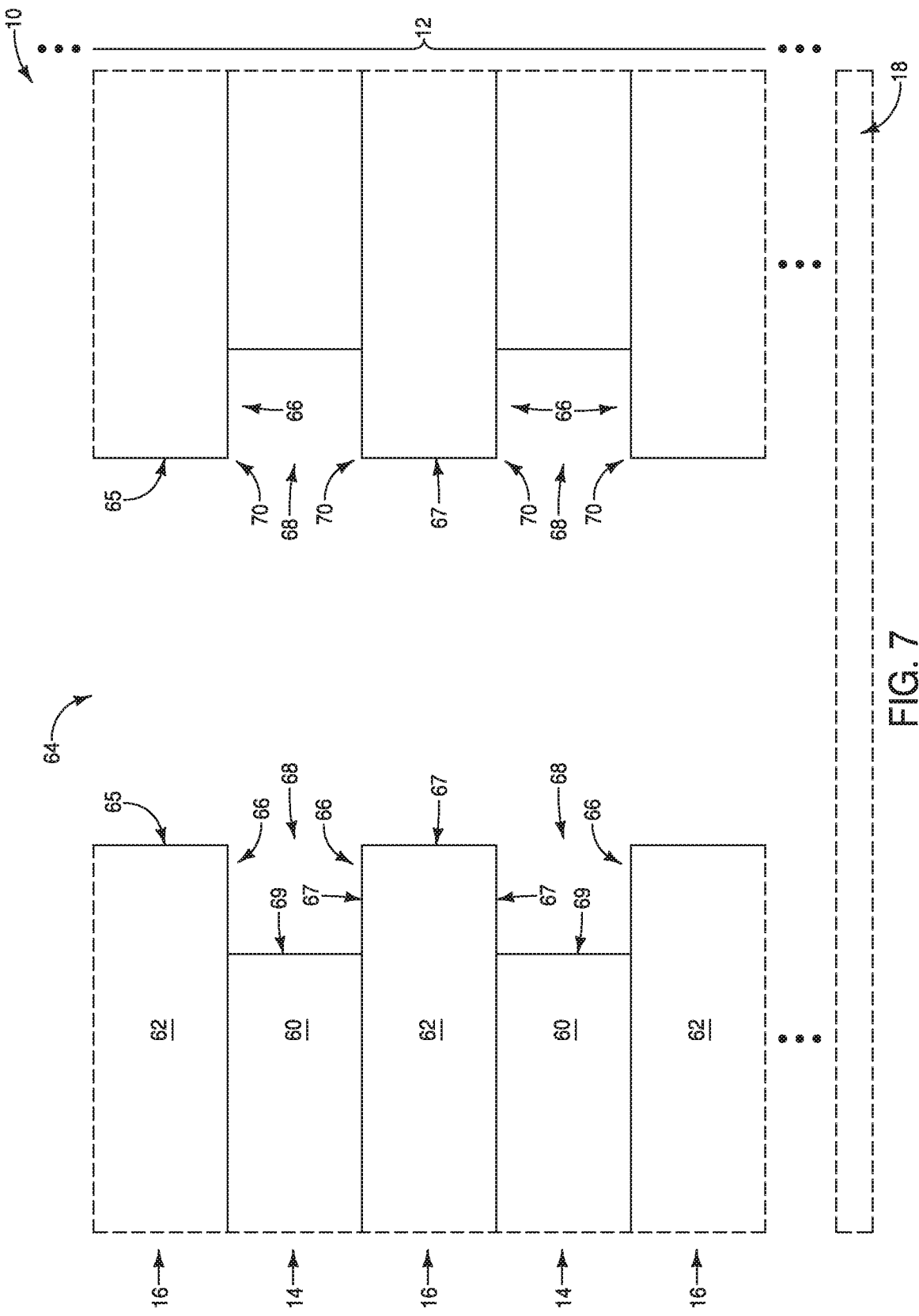

Referring to FIG. 7, the first levels 14 are recessed relative to the second levels 16 along the sidewalls 65 of the opening 64. After the recessing, the second levels 16 have projecting terminal ends 66 which extend inwardly beyond the recessed first levels 14. The terminal ends 66 have surfaces 67 of the second material 62. The recessed first levels 14 have surfaces 69 of the first material 60. Cavities (gaps) 68 are vertically between the terminal ends 66. The surfaces 69 may be considered to be along inner edges of the cavities 68.

The surface 65 of the opening 64 is an undulating sidewall surface at the process stage of FIG. 7. The terminal ends 66 have substantially square corners 70 along the undulating sidewall surface.

Figure 8:
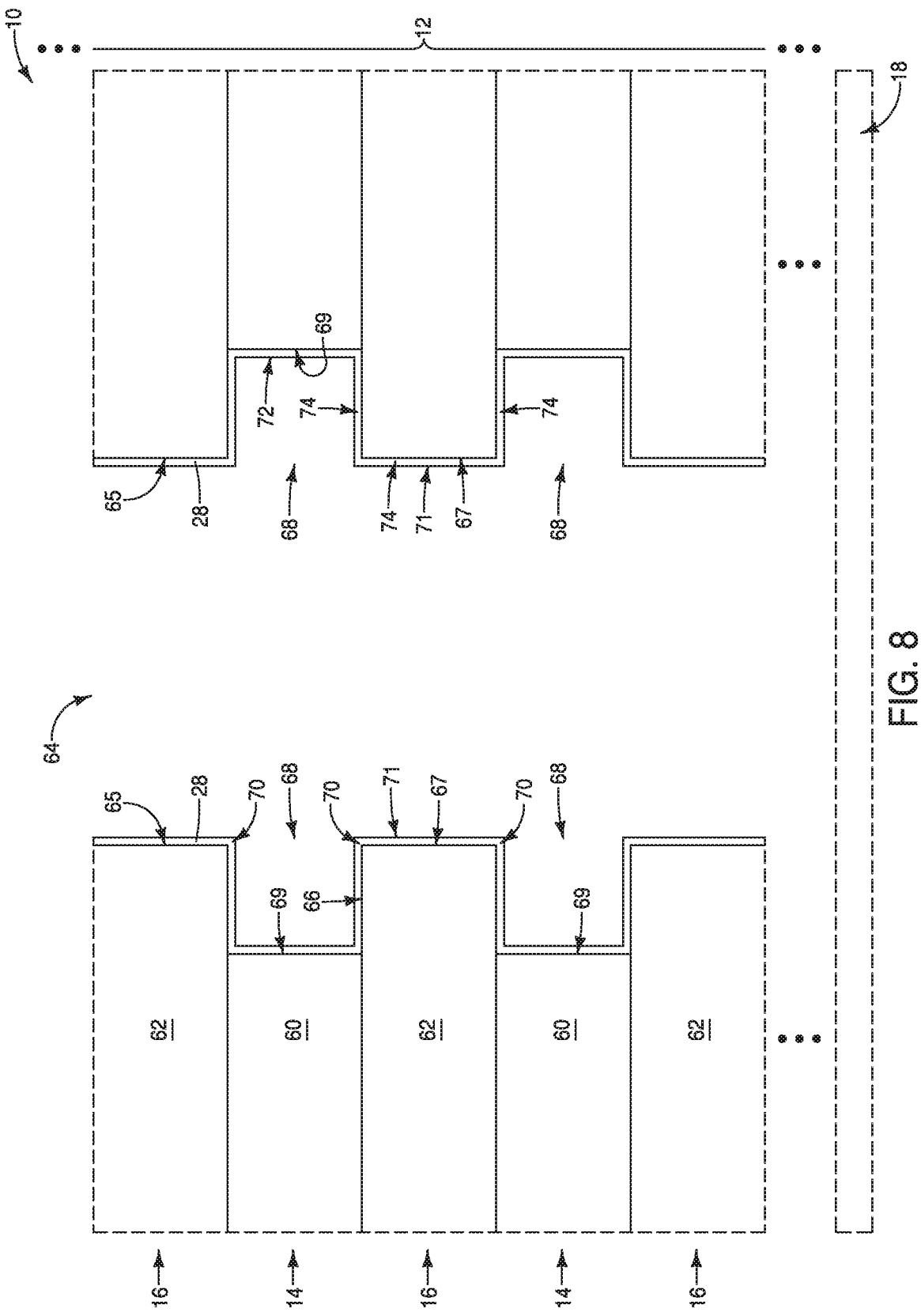

Referring to FIG. 8, high-k dielectric material 28 is formed along the undulating sidewall surface 65. The term "high-k" means a dielectric constant greater than that of silicon dioxide. In some embodiments, the high-k dielectric material 28 may comprise, consist essentially of, or consist of one or more of aluminum oxide (AlO), hafnium oxide (HfO), hafnium silicate (HfSiO), zirconium oxide (ZrO) and zirconium silicate (ZrSiO); where the chemical formulas indicate primary constituents rather than specific stoichiometries.

The high-k dielectric material 28 has a substantially uniform thickness along the entirety of the undulating sidewall 65; with the term "substantially uniform" meaning uniform to within reasonable tolerances of fabrication and measurement. The high-k dielectric material 28 may be formed to any suitable thickness; and in some embodiments may be formed to a thickness within a range of from about 1 nanometer (nm) to about 5 nm.

The high-k dielectric material 28 wraps around the terminal ends 66, and extends around the substantially square corners 70.

The high-k dielectric material may be considered to have first portions 72 along the surfaces 69 of the first material 60, and to have second portions 74 along the surfaces 67 of the second material 62.

The high-k dielectric material has an undulating outer topography 71.

Figure 9:
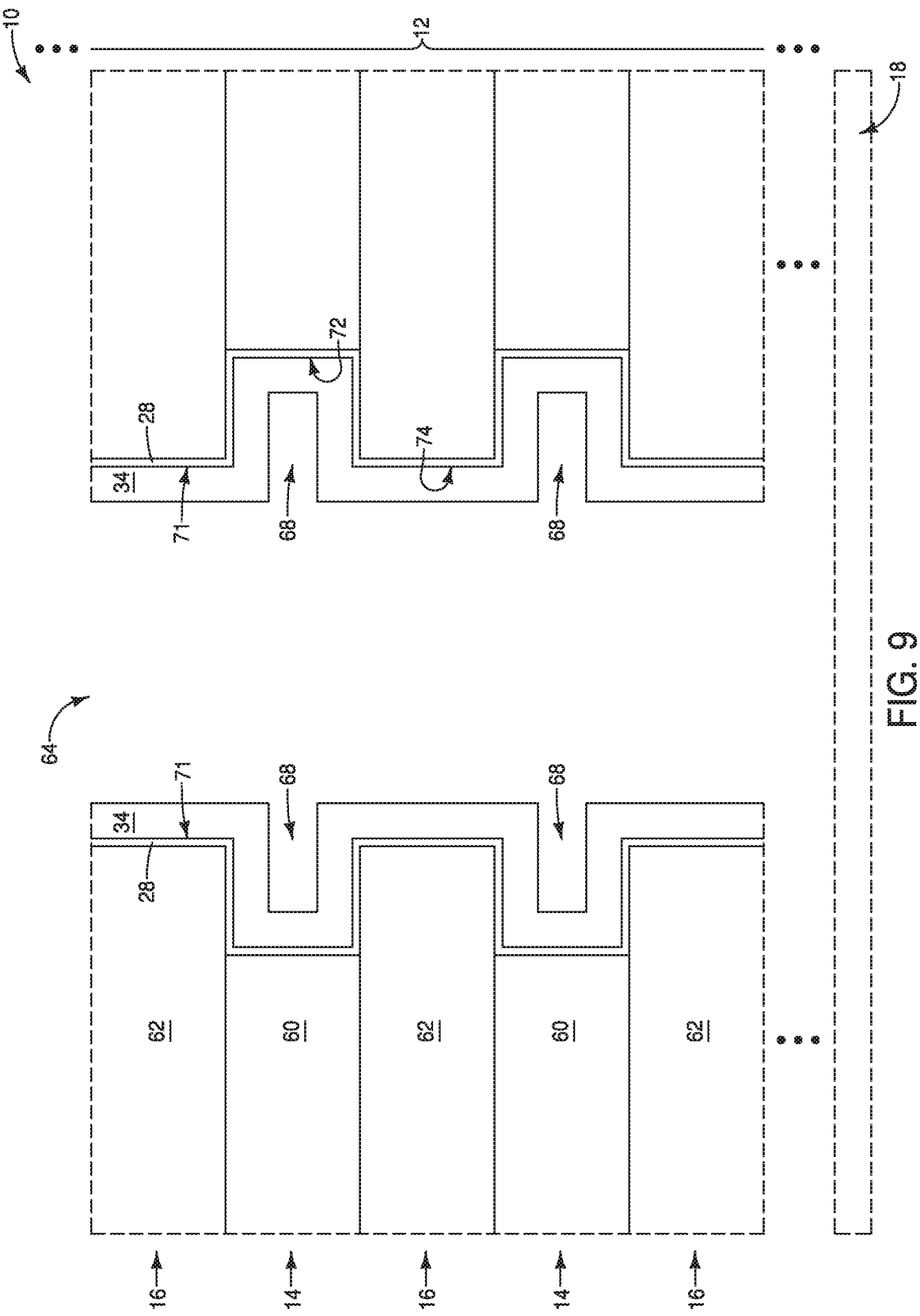

Referring to FIG. 9, charge-blocking material 34 is formed adjacent the high-k dielectric material 28. In the shown embodiment, the charge-blocking material 34 is formed along the undulating outer topography 71 of the high-k dielectric material 28, and extends into the cavities 68.

The charge-blocking material 34 may comprise any suitable composition(s); and in some embodiments may comprise, consist essentially of, or consist of one or both of silicon oxynitride (SiON) and silicon dioxide ($SiO_2$).

Figure 10:
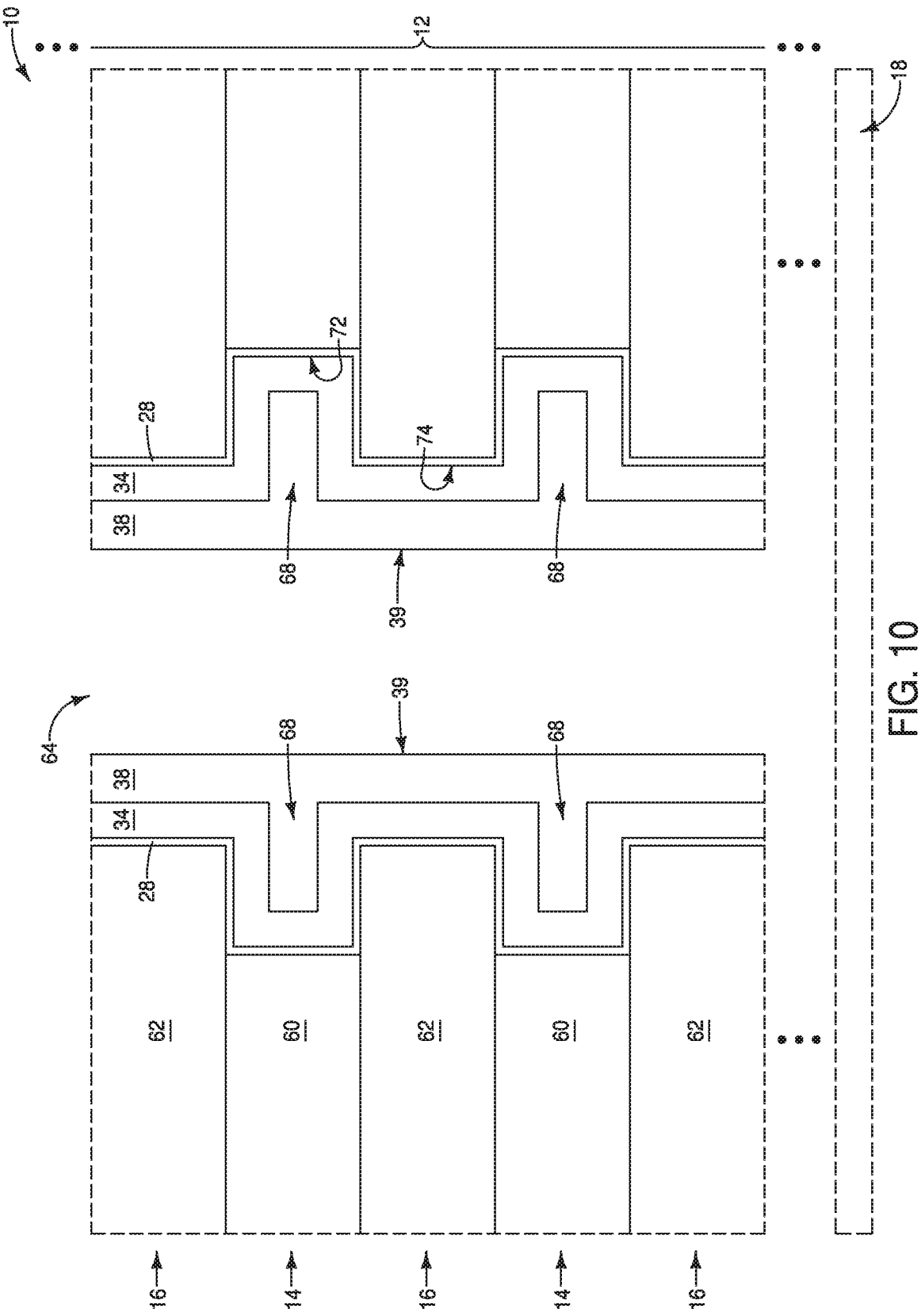

Referring to FIG. 10, charge-storage material 38 is formed adjacent the charge-blocking material 34. In the illustrated embodiment, the charge-storage material 38 fills the gaps 28, and has substantially vertical surfaces 39 along the vertical stack 12. The surfaces 39 become inner surfaces of the opening 64 at the process stage of FIG. 10.

The charge-storage material 38 may comprise any suitable composition(s). In some embodiments the charge-storage material 38 may comprise charge-trapping materials; such as, for example, silicon nitride, silicon oxynitride, conductive nanodots, etc. For instance, in some embodiments the charge-storage material 38 may comprise, consist essentially of, or consist of silicon nitride. In alternative embodiments, the charge-storage material 38 may be configured to include floating gate material (such as, for example, polycrystalline silicon).

Figure 11:
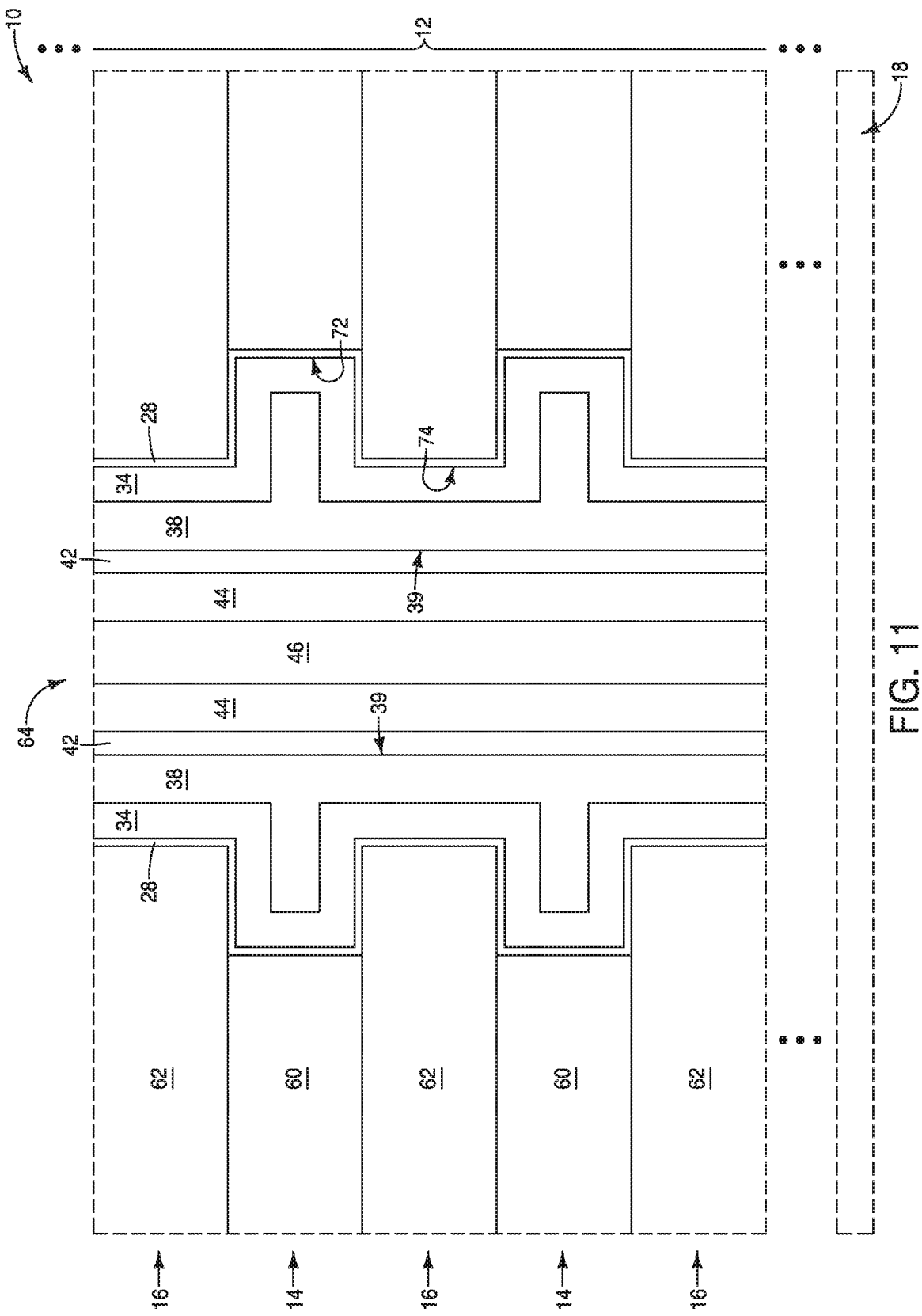

Referring to FIG. 11, gate-dielectric material (i.e., tunneling material) 42 is formed adjacent the charge-storage material 38, and along the vertical surfaces 39. The gate-dielectric material 42 may comprise any suitable composition(s). In some embodiments, the gate-dielectric material 42 may comprise, for example, one or more of silicon dioxide, silicon nitride, silicon oxynitride, aluminum oxide, hafnium oxide, zirconium oxide, etc. The gate-dielectric material 42 may be bandgap-engineered to achieve desired electrical properties; and accordingly may comprise a combination of two or more different materials.

Channel material 44 is formed adjacent the gate-dielectric material 42, and extends vertically along the stack 12. The channel material 44 comprises semiconductor material; and may comprise any suitable composition or combination of compositions. For instance, the channel material 44 may comprise one or more of silicon, germanium, III/V semiconductor materials (e.g., gallium phosphide), semiconductor oxides, etc.; with the term III/V semiconductor material referring to semiconductor materials comprising elements selected from groups III and V of the periodic table (with groups III and V being old nomenclature, and now being referred to as groups 13 and 15). In some embodiments, the channel material 44 may comprise, consist essentially of, or consist of silicon.

Insulative material 46 is formed adjacent the channel material 44, and fills a remaining portion of the opening 64. The insulative material 46 may comprise any suitable composition(s); and in some embodiments may comprise, consist essentially of, or consist of silicon dioxide.

In the illustrated embodiment of FIG. 11, the channel material 44 is configured as an annular ring which surrounds the insulative material 46. Such configuration of the channel material may be considered to comprise a hollow channel configuration, in that the insulative material 46 is provided within a "hollow" in the annular-ring-shaped channel configuration. In other embodiments (not shown), the channel material may be configured as a solid pillar configuration.

Figure 12:
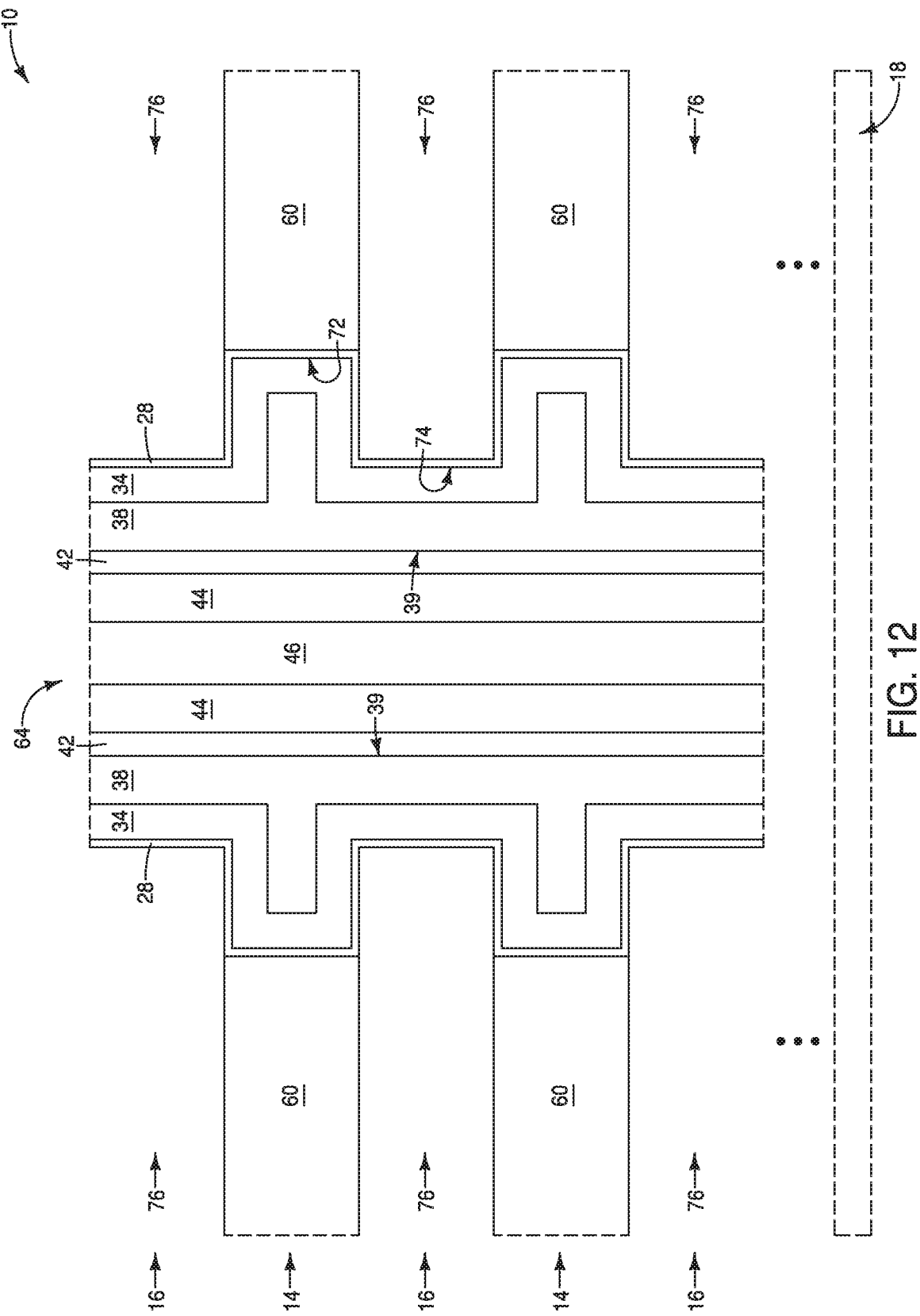

Referring to FIG. 12, the second material 62 (FIG. 11) is removed to leave voids 76. The voids 76 may be referred to as first voids to distinguish them from other voids which are formed at later process stages.

Figure 13:
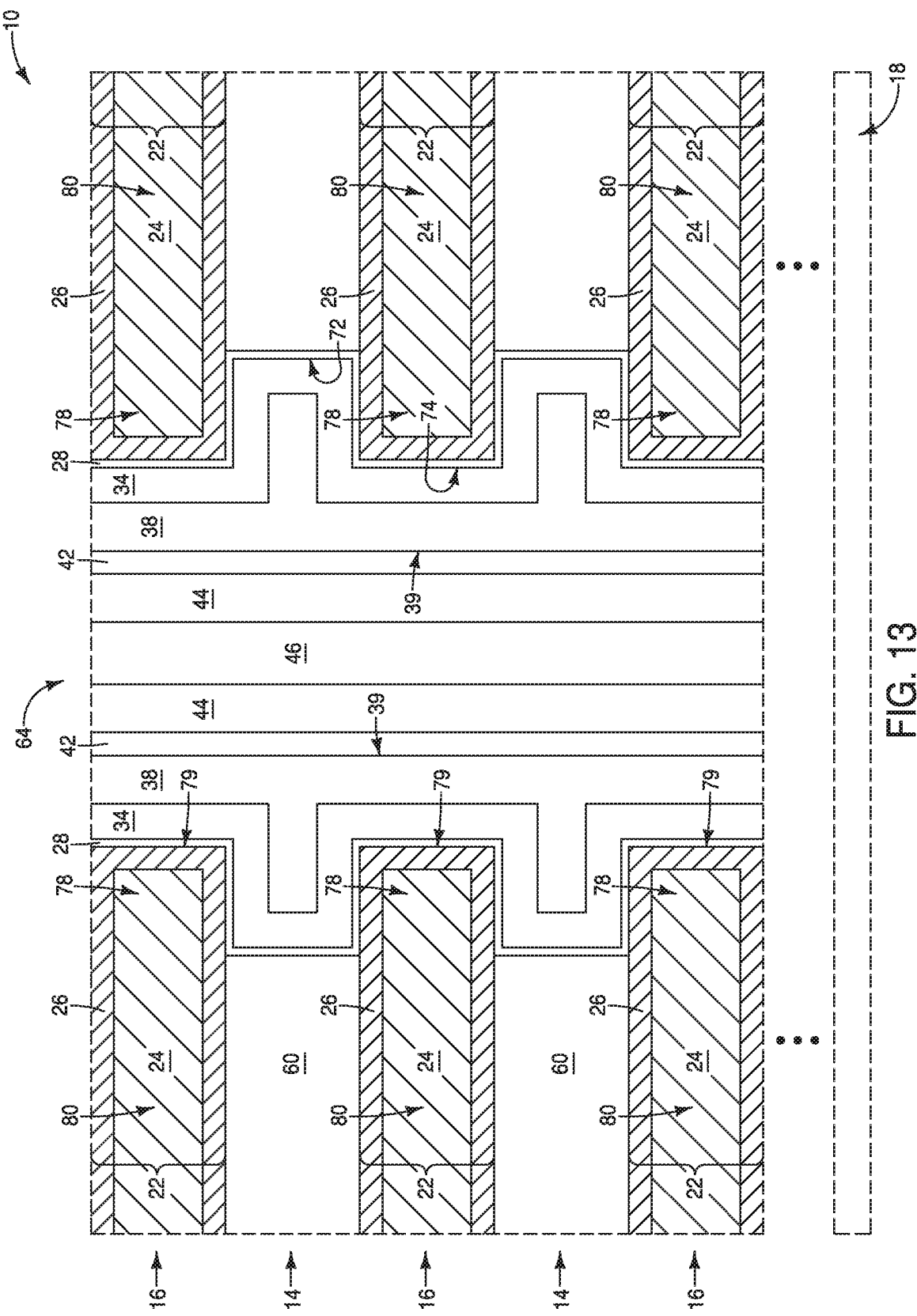

Referring to FIG. 13, conductive materials 24 and 26 are formed within the voids 76. The conductive materials 24 and 26 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive materials 24 and 26 are compositionally different from one another. In some embodiments the core material 24 may comprise one or more metals (e.g., may comprise tungsten), and the outer conductive material 26 may comprise one or more metal nitrides (e.g., may comprise titanium nitride).

The conductive materials 24 and 26 together form conductive regions 22 along the levels 16. Such conductive regions may be considered to correspond to conductive levels formed within the first voids 76. The conductive levels 22 have terminal regions 78 adjacent the high-k dielectric material 28, and have nonterminal regions 80 proximate the terminal regions. The terminal regions 78 have ends 79, and the high-k dielectric material 28 wraps around such ends. The high-k dielectric material 28 is not along the nonterminal regions 80 of the conductive levels 22.

Figure 14:
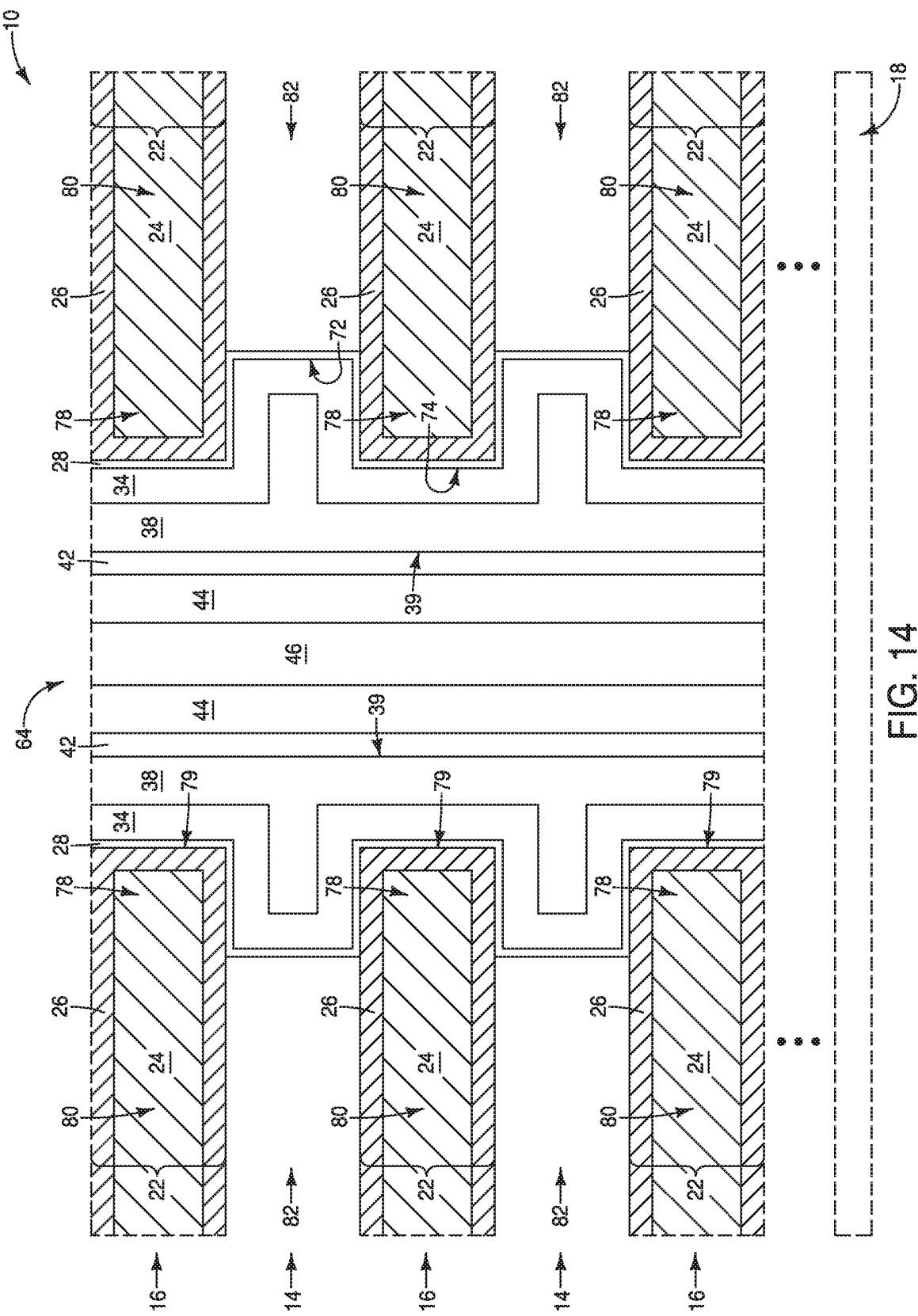

Referring to FIG. 14, the first material 60 (FIG. 13) is removed to form second voids 82.

Figure 15:
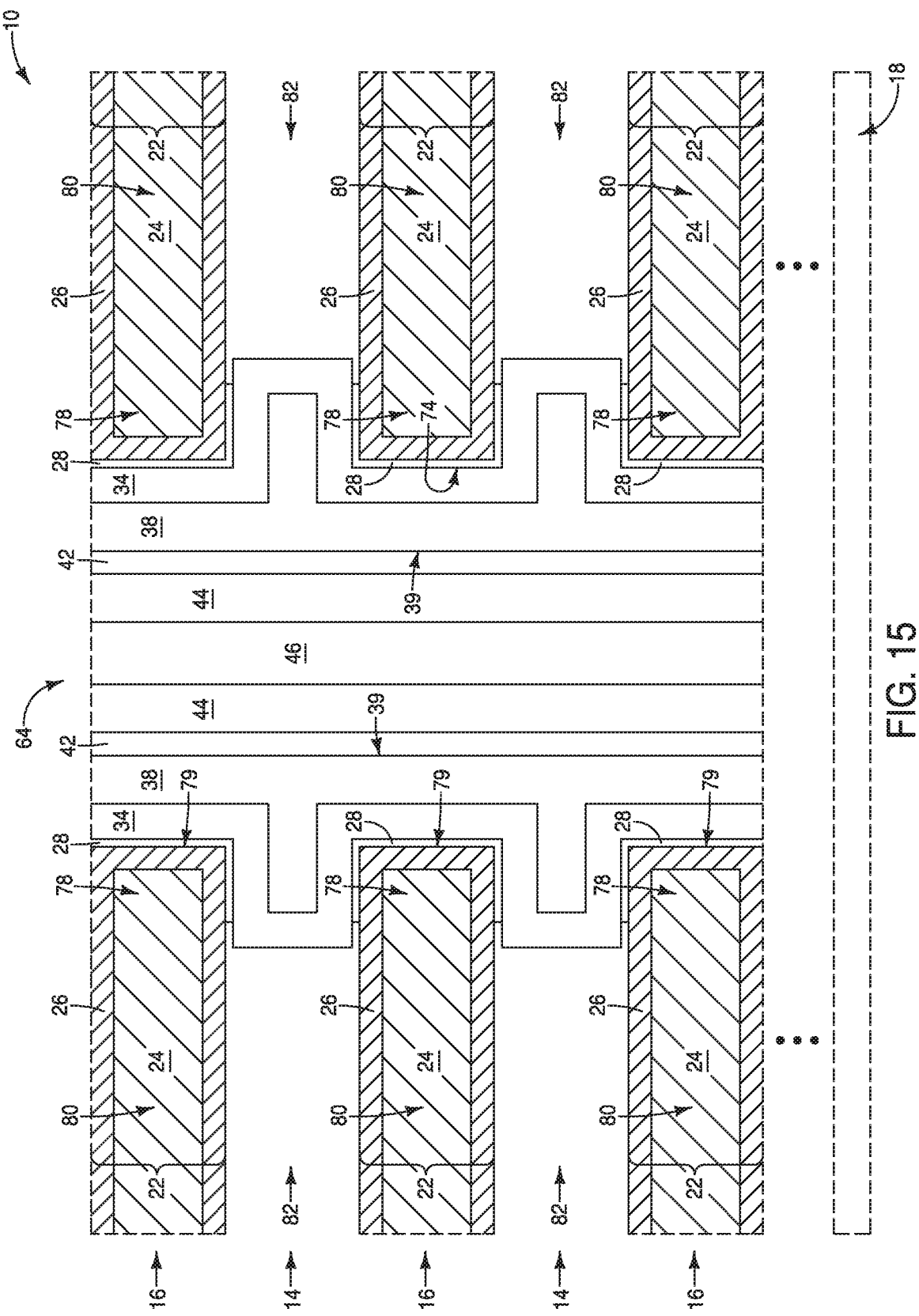

Referring to FIG. 15, the second voids 82 are extended through the high-k dielectric material 28 to remove the first portions 72 (FIG. 14) of the high-k dielectric material.

Figure 16:
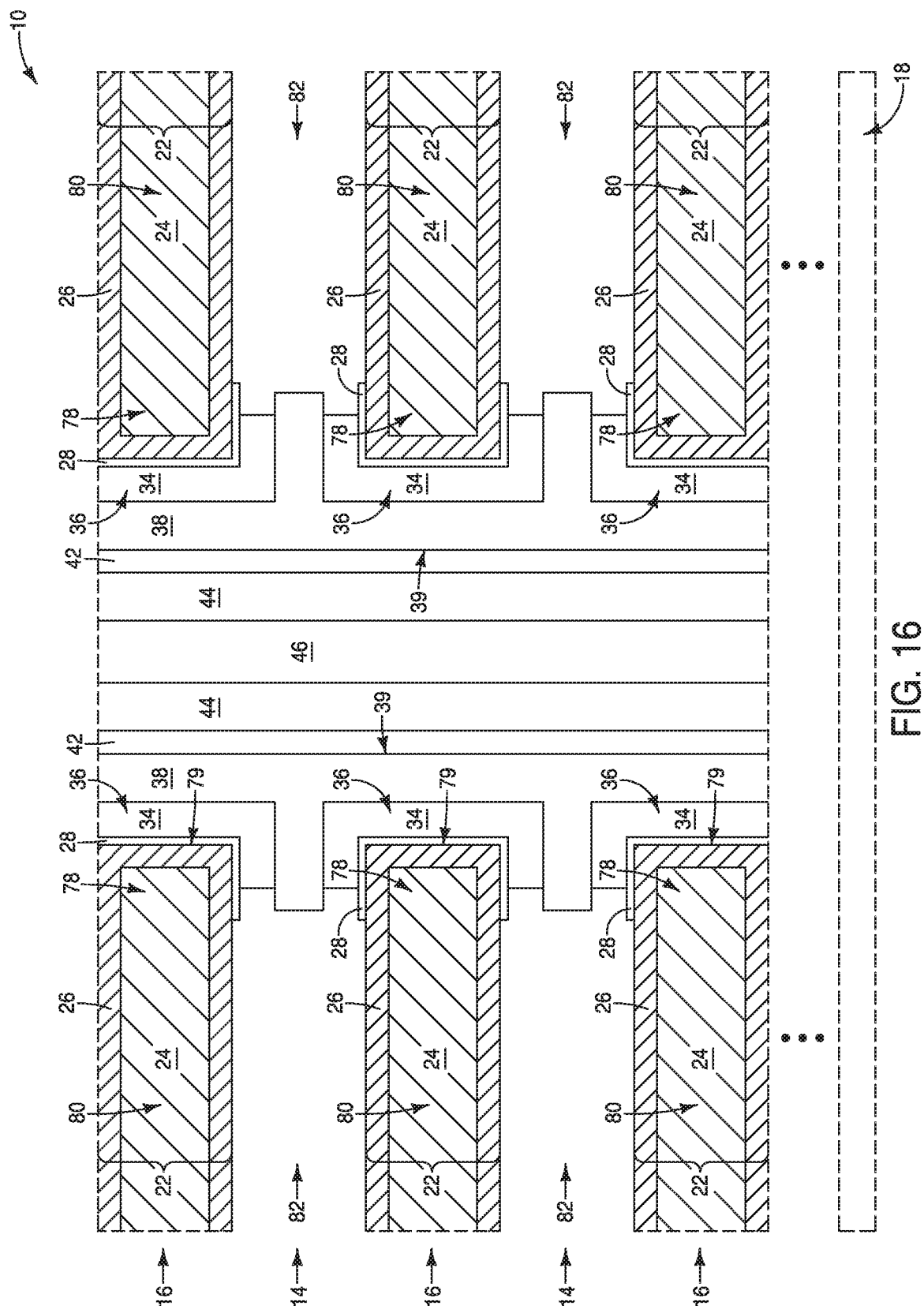

Referring to FIG. 16, the second voids 82 are extended through the charge-blocking material 34 to expose regions of the charge-storage material 38. The remaining regions of the charge-blocking material 34 are configured as vertically-spaced segments 36.

Figure 17:
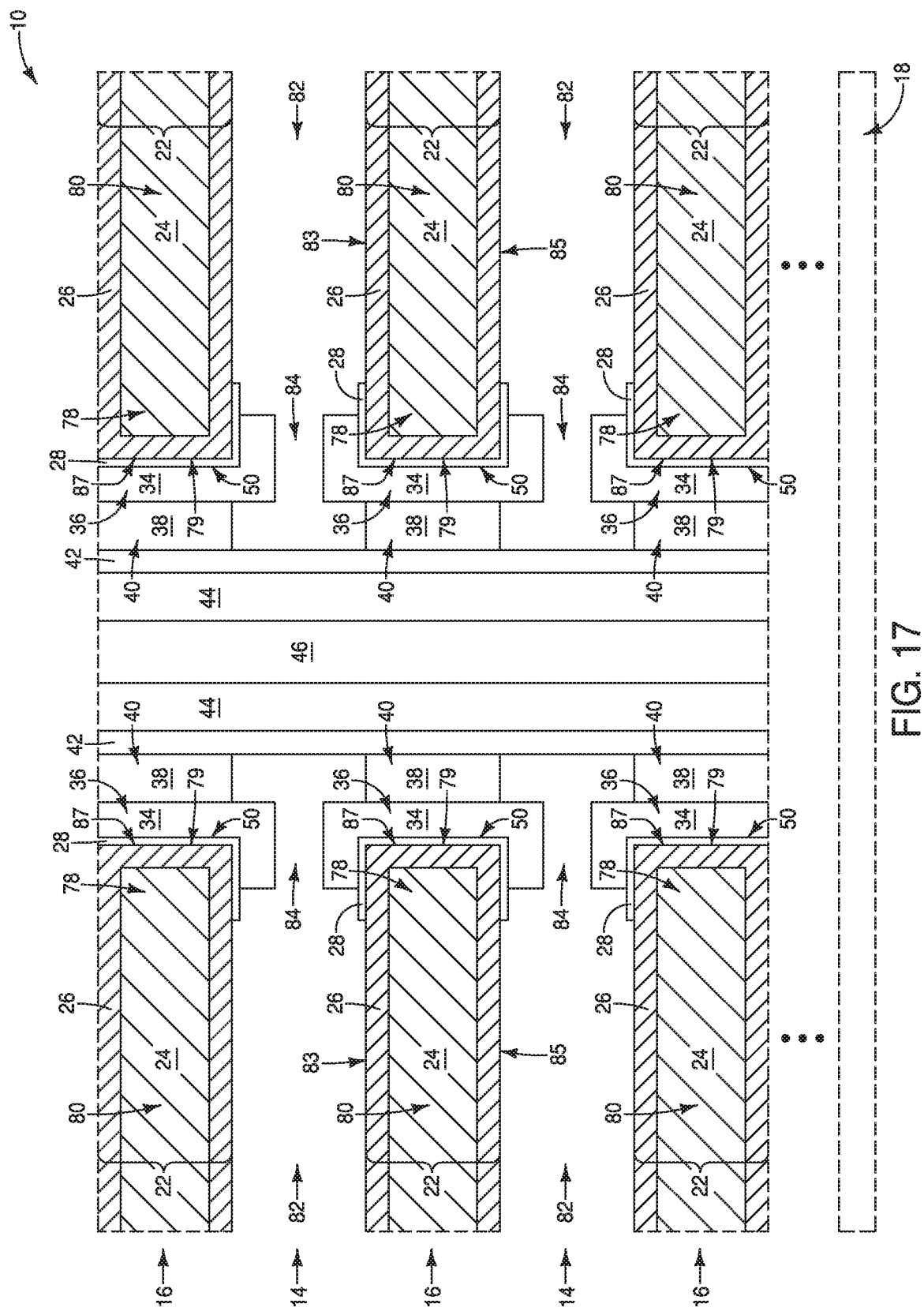

Referring to FIG. 17, the second voids 82 are extended through the charge-storage material 38 to divide the charge-storage material into vertically-spaced segments 40. In some embodiments, the segments 36 of the charge-blocking material 34 may be referred to as first segments, and the segments 40 of the charge-storage material 38 may be referred to as second segments.

The conductive levels 22 may be considered to have top surfaces 83, bottom surfaces 85, and vertically-extending sidewall surfaces (i.e., front surfaces) 87 between the top and bottom surfaces. The high-k dielectric material 28 may be considered to be configured as caps 50 which extend along the top surfaces 83, bottom surfaces 85, and sidewall surfaces 87 of the terminal regions 78 of the conductive levels 22; and which are not along the nonterminal regions 80 of the conductive levels 22.

The charge-blocking-material segments 36 extend around the terminal ends 79 (i.e., wrap around the terminal regions 78), and in the shown embodiment only partially overlap the caps 50 along the top and bottom surfaces 83 and 85.

The illustrated embodiment has gaps 84 within intervening regions between the vertically-stacked first and second segments 36 and 40.

Figure 18:
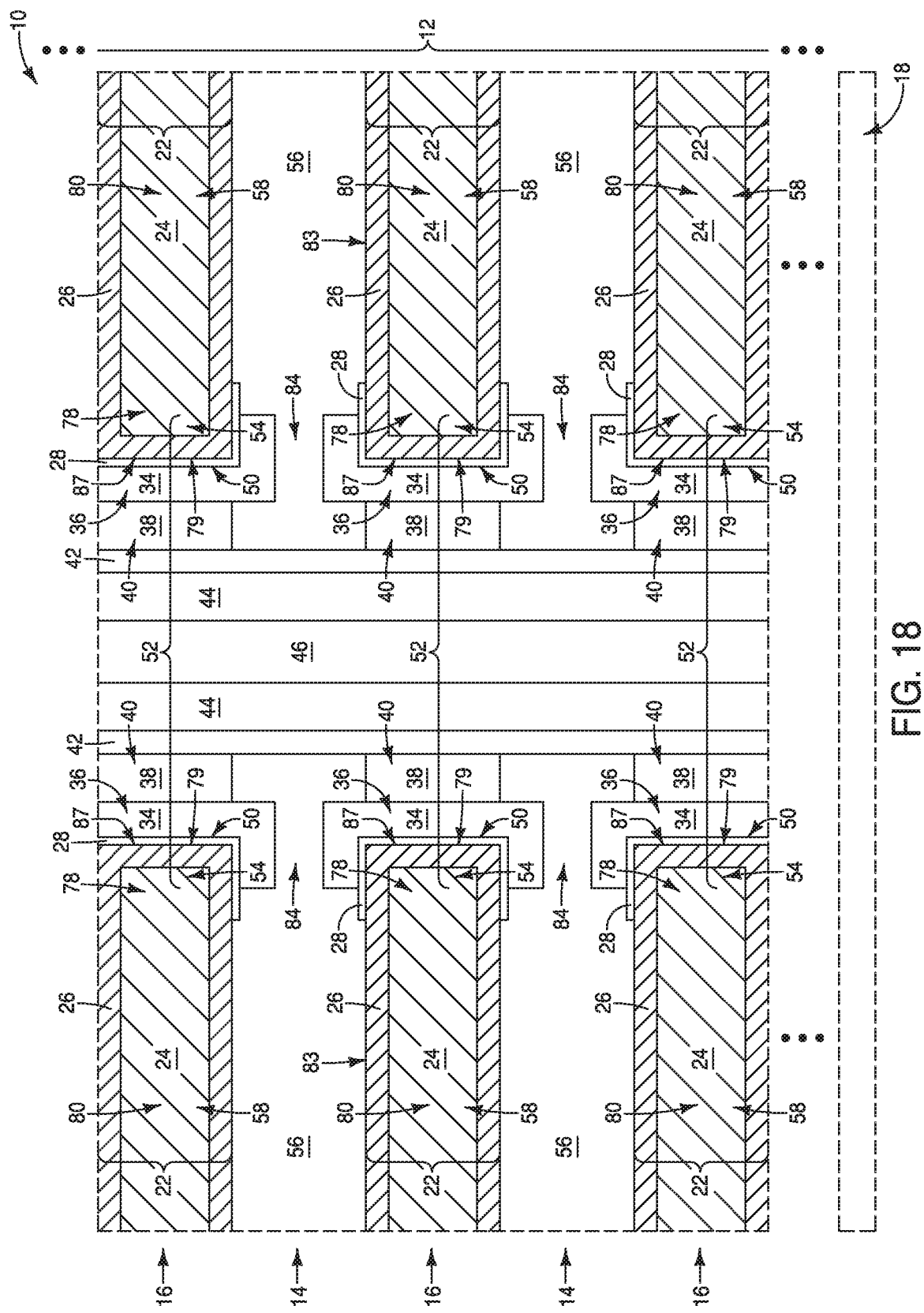

Referring to FIG. 18, insulative material 56 is formed within the second voids 82 (FIG. 17). The insulative material 56 may comprise any suitable composition(s); and in some embodiments may comprise, consist essentially of, or consist of silicon dioxide.

The integrated assembly 10 of FIG. 18 may be considered to comprise a stack of alternating insulative levels 14 and conductive levels 16; with the conductive levels 16 including (in some embodiments, corresponding to) the conductive levels (regions) 22, and comprising the conductive materials 24 and 26. In some embodiments, the conductive levels 16 may be considered to comprise at least two conductive materials. The caps 50 of the high-k dielectric material 28 may be considered to be directly against one of such conductive materials (for instance, in the shown embodiment the caps 50 are directly against the conductive material 26).

In the illustrated embodiment of FIG. 18, the insulative material 56 entirely fills the second voids 82 (FIG. 17).

The conductive levels 16 may be considered to be memory cell levels (also referred to herein as wordline levels or as control gate levels) of a NAND configuration. The NAND configuration includes strings of memory cells (i.e., NAND strings), with the number of memory cells in the strings being determined by the number of vertically-stacked levels 16. The NAND strings may comprise any suitable number of memory cell levels. For instance, the NAND strings may have 8 memory cell levels, 16 memory cell levels, 32 memory cell levels, 64 memory cell levels, 512 memory cell levels, 1024 memory cell levels, etc. The vertical stack 12 is indicated to extend vertically beyond the illustrated region to show that there may be more vertically-stacked levels than those specifically illustrated in the diagram of FIG. 18.

NAND memory cells 52 comprise the dielectric barrier material 28, charge-blocking material 34, charge-storage material 38, gate-dielectric material 42 and channel material 44. The illustrated NAND memory cells 52 form a portion of a vertically-extending string of memory cells. Such string may be representative of a large number of substantially identical NAND strings formed during fabrication of a NAND memory array (with the term "substantially identical" meaning identical to within reasonable tolerances of fabrication and measurement).

Each of the NAND memory cells 52 includes a control gate region 54 within the terminal end 78. The control gate regions 54 comprise control gates analogous to those described above with reference to FIGS. 1-4. The conductive levels 16 comprise regions 58 adjacent to, or proximate, the control gate regions 54. The regions 58 may be referred to as second regions, or as wordline regions; and are within the nonterminal regions 80 of the conductive levels.

In the embodiment of FIG. 18, the high-k dielectric material 28 wraps around the ends 79 of the control gate regions 54; and the high-k dielectric material 28 is not along the second regions 58.

FIG. 18A shows a top view of a region of the assembly 10 at the processing stage of FIG. 18, and shows that the various materials 28, 34, 38, 42 and 44 may be configured as annular rings in some example embodiments.

Figure 19:
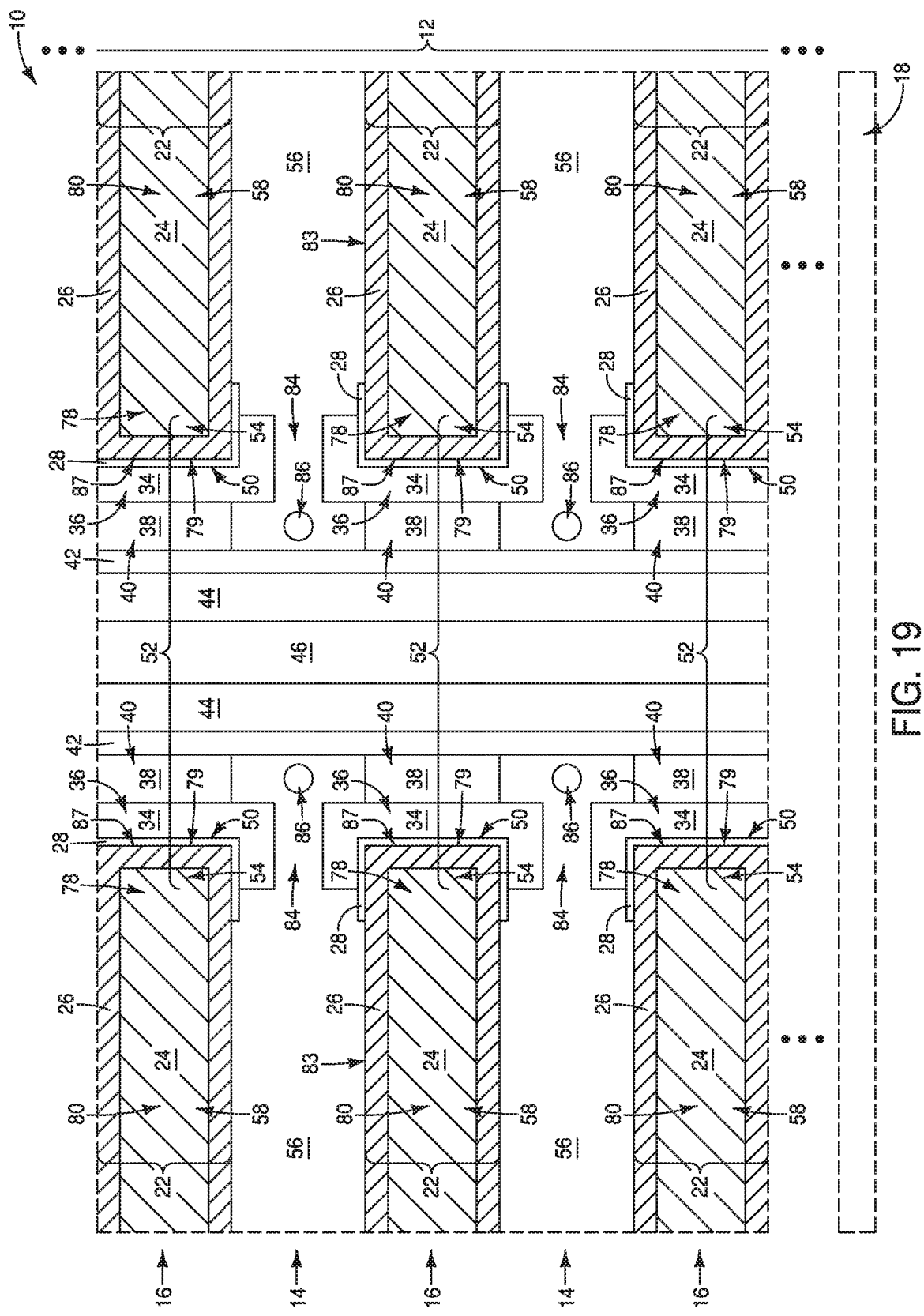
FIG. 19 is a diagrammatic cross-sectional side view of an integrated assembly showing a region of an example NAND memory array.

In the embodiment of FIG. 18, the insulative levels 14 are entirely filled with the insulative material 56. Accordingly, the gaps 84 between the vertically-stacked first and second segments 36 and 40 are entirely filled with the insulative material 56. In other embodiments, voids may remain within the gaps 84 as shown in FIG. 19. Specifically, FIG. 19 shows voids 86 within regions of the insulative material 56 that extend into the gaps 84. The voids 86 may be filled with air or any other suitable gas.

Figure 20:
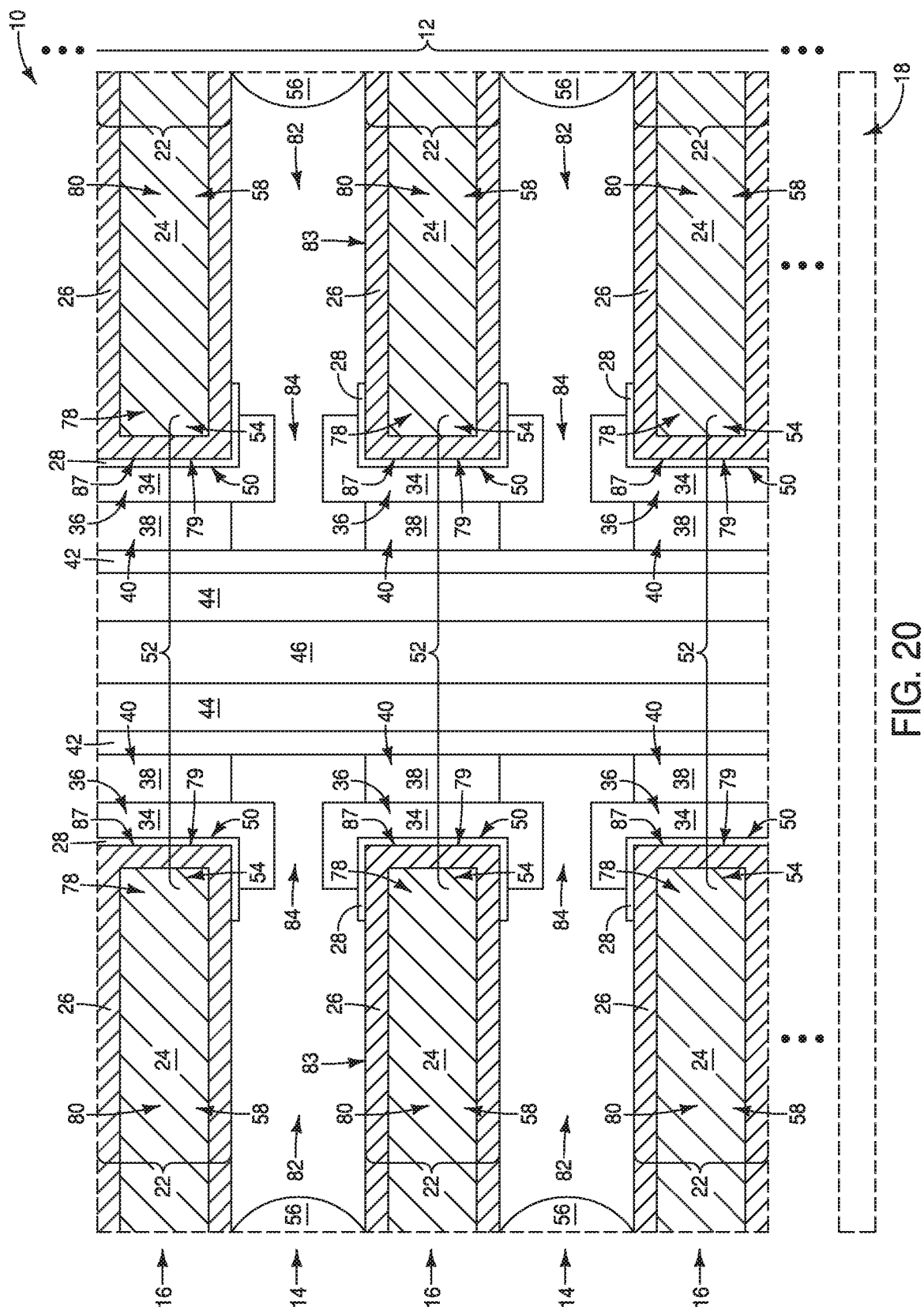
FIG. 20 is a diagrammatic cross-sectional side view of an integrated assembly showing a region of an example NAND memory array.

FIG. 20 shows a configuration analogous to that of FIG. 18, but in which the voids 82 are only partially filled with the insulative, material 56. Accordingly, portions of the voids 82 remain within the insulative levels 14. The remaining portions of the voids 82 are capped with the insulative material 56. The voids 82 may be filled with air or any other suitable gas.

An advantage of the configurations of FIGS. 19 and 20 (i.e., configurations having voids within the insulative levels 14) is that such may alleviate capacitive coupling between vertically-neighboring materials in the event that such capacitive coupling is found to be problematic.

The embodiments of FIGS. 18-20 show the gaps 84 extending through the materials 34 and 38, and stopping at the tunneling material 42. In other embodiments, the gaps 84 may extend through the tunneling material.

The channel material 44 is "flat" (i.e., is substantially vertically of continuous thickness, and is substantially vertically straight) in the configurations of FIGS. 18-20, as opposed to being undulating. The flat channel material may positively impact string current as compared to non-flat configurations. In some embodiments, the configuration of the channel material 44 may be referred to as a "flat configuration". Notably, the segments 40 of the charge-storage material 38 are also "flat"; and may be considered to each be in a "flat configuration". The flat segments 40 may have a favorable charge distribution as compared to non-flat segments of the charge-storage material.

In some embodiments, the segments 40 of the charge-storage material 38 may be formed in non-flat (i.e., rounded) configurations, and the channel material 44 may be formed in an undulating configuration. The non-flat configurations of the segments 40 of the charge-storage material 38, and the undulating configuration of the channel material 44, may be advantageous in some applications. FIGS. 21-25 describe an example process for forming the charge-storage-material segments 40 in rounded configurations, and for forming the channel material 44 in an undulating configuration.

Figure 21:
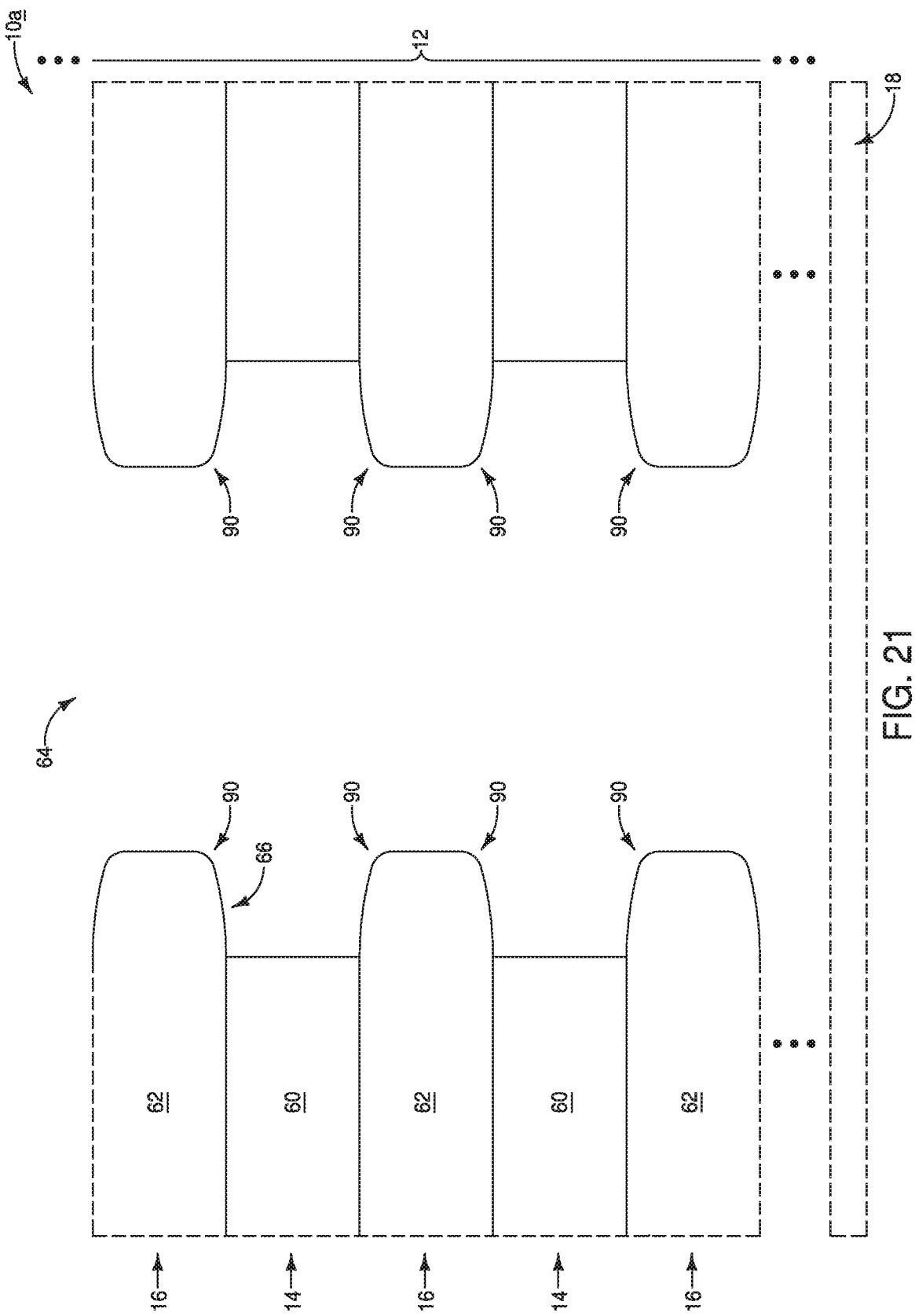
FIGS. 21-24 are diagrammatic cross-sectional side views of a region of an integrated assembly shown at example sequential process stages of an example method for forming an example NAND memory array.

Referring to FIG. 21, an assembly 10a is shown at a process stage which may follow that of FIG. 7. The terminal ends 66 are rounded; and specifically the substantially square corners 70 (FIG. 7) are converted into rounded corners 90.

Figure 22:
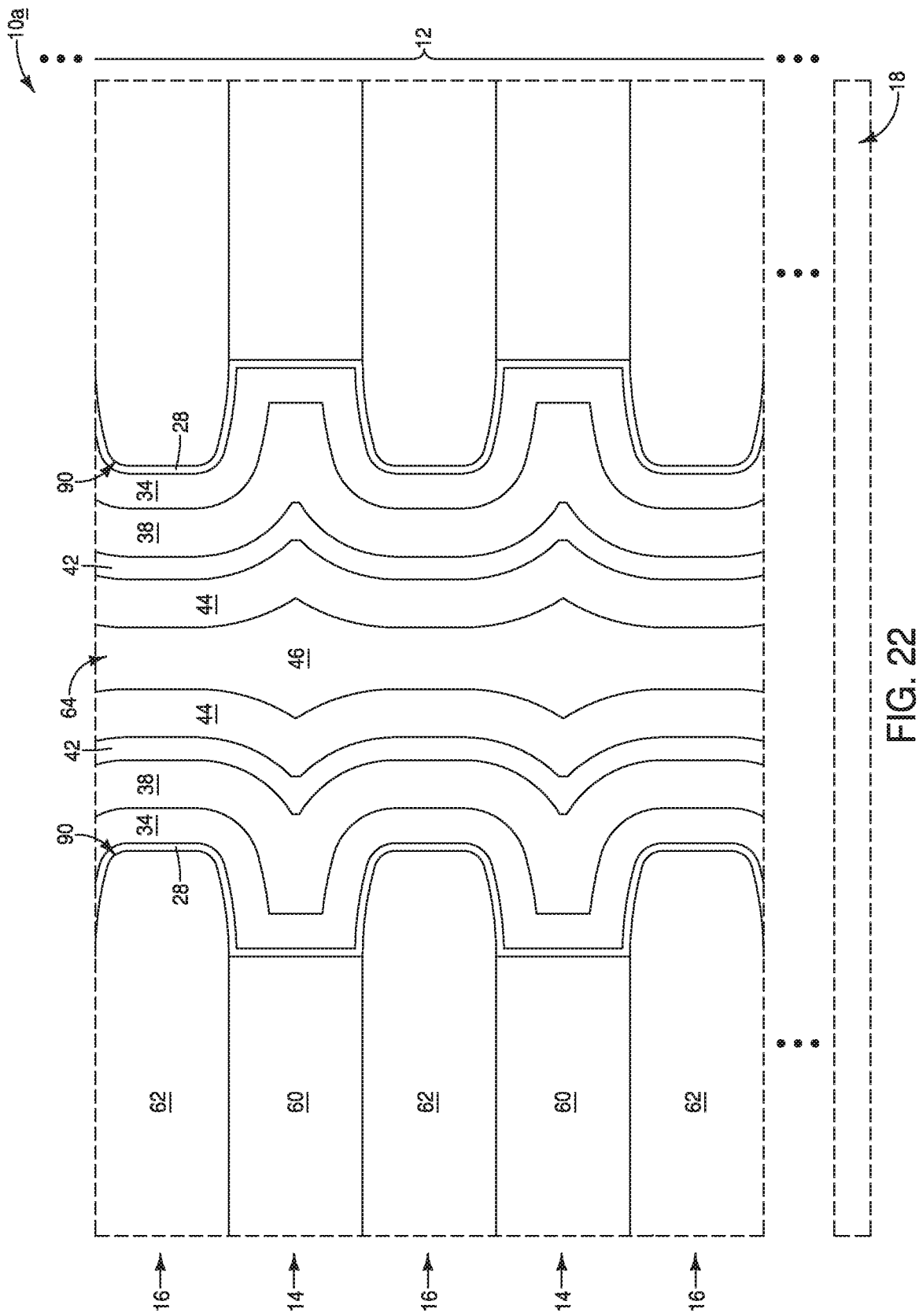

Referring to FIG. 22, the assembly 10a is shown at a processing stage analogous to that of FIG. 11. The high-k dielectric material 28 is formed within the opening 64 and along the rounded corners 90. Subsequently, the charge-blocking material 34, charge-storage material 38, tunneling material 42, channel material 44, and dielectric material 46 are formed within the opening 64.

Figure 23:
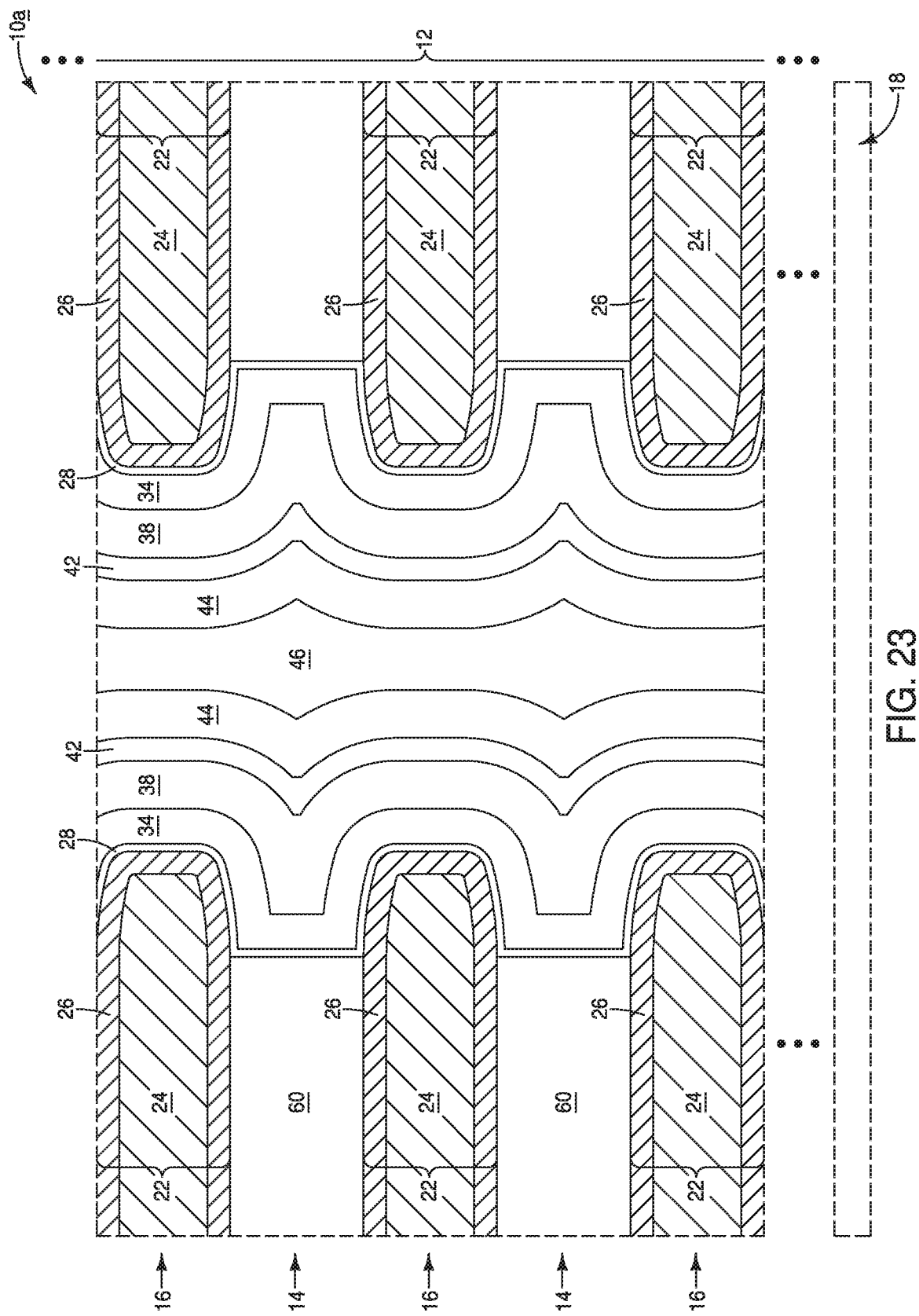

Referring to FIG. 23, the assembly 10a is shown at a process stage analogous to that of FIG. 13. The sacrificial material 62 (FIG. 22) has been replaced with conductive regions 22.

Figure 24:
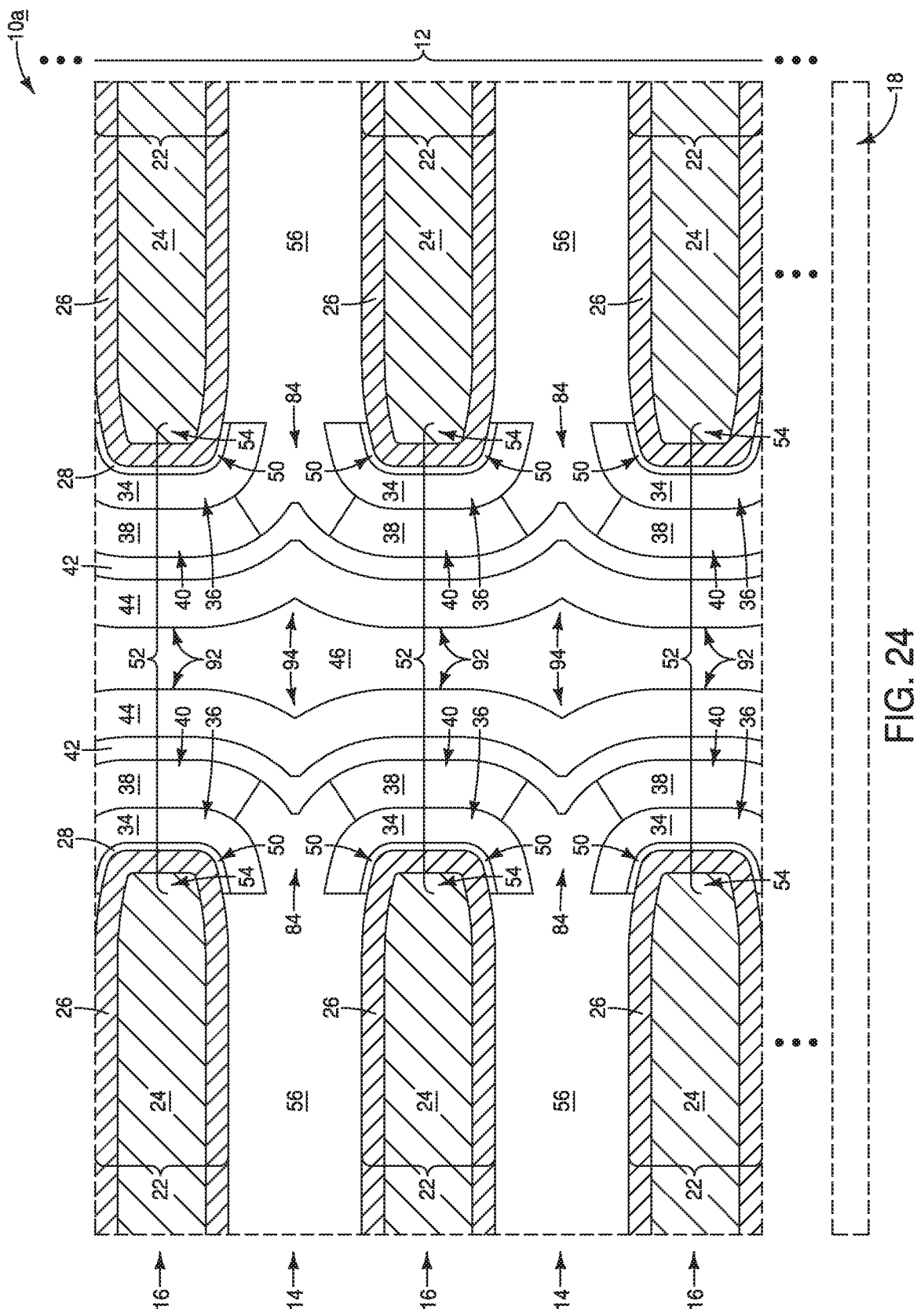

Referring to FIG. 24, the assembly 10a is shown at a process stage analogous to that of FIG. 18. Memory cells 52 comprise control-gate regions 54 of the conductive levels 16. The memory cells also include segments 36 and 40 of the charge-blocking material 34 and the charge-storage material 38, respectively; and comprise regions of the tunneling material 42 and the channel material 44. In the embodiment of FIG. 24, the charge-blocking-material segments 36 and the charge-storage-material segments 44 are rounded (i.e., are in rounded configurations), rather than being in the flat configurations of FIG. 18. In some embodiments, the segments 36 and 40 of FIG. 24 may be considered to be in substantially rounded configurations; with the term "substantially rounded" indicating that the configurations may appear more rounded than flat, but may not be entirely rounded.

In the embodiment of FIG. 24, the channel material 44 extends vertically along the stack 12, and undulates between peak regions 92 along the second segments 40 (i.e., the charge-storage-material segments), and valley regions 94 along the gaps 84.

The gaps 84 of FIG. 24 are analogous to those of FIG. 18, and extend through the materials 34 and 38. In other embodiments, the gaps 84 may also extend through the tunneling material 42.

Figure 25:
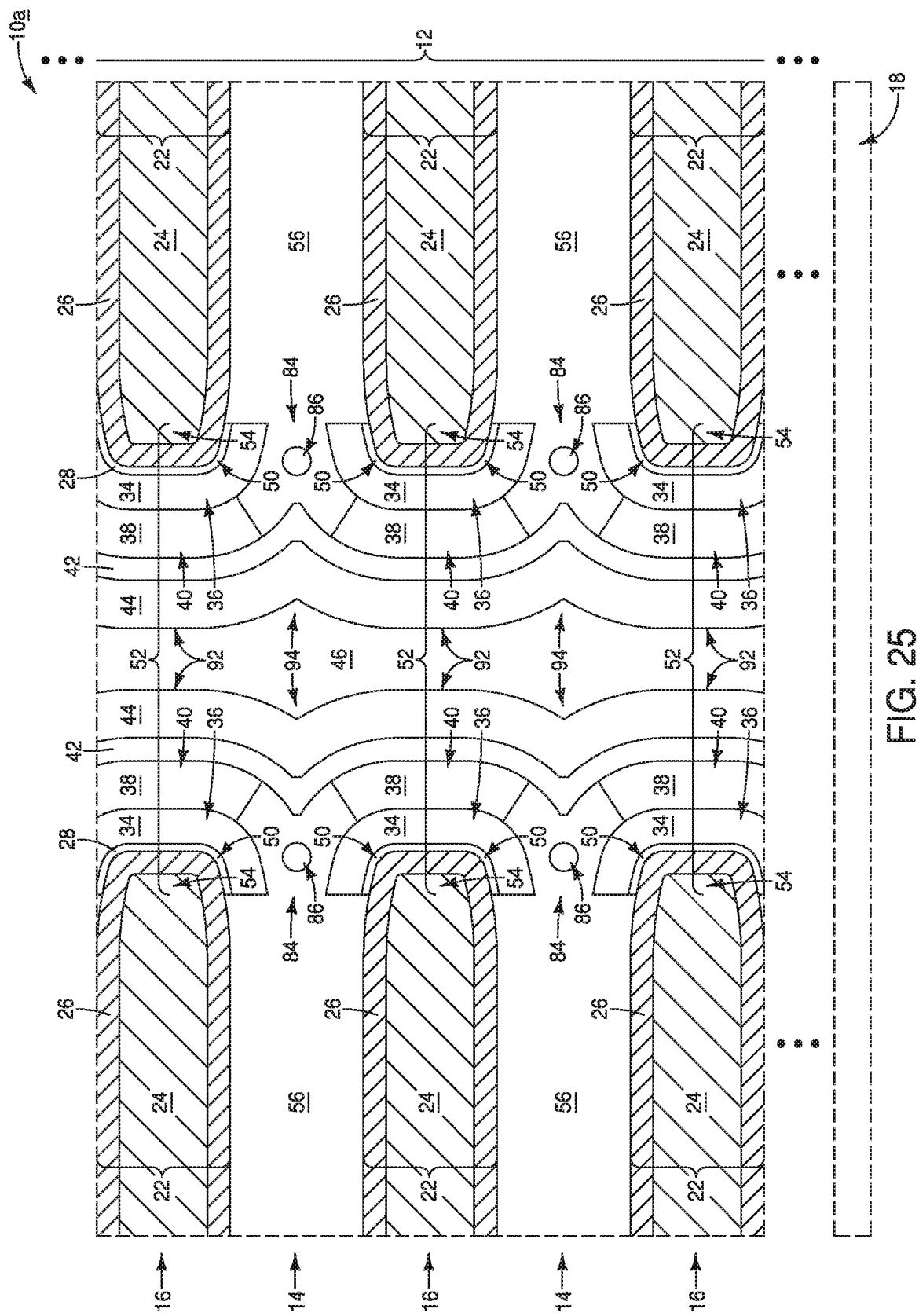
FIG. 25 is a diagrammatic cross-sectional side view of an integrated assembly showing a region of an example NAND memory array.
Figure 26:
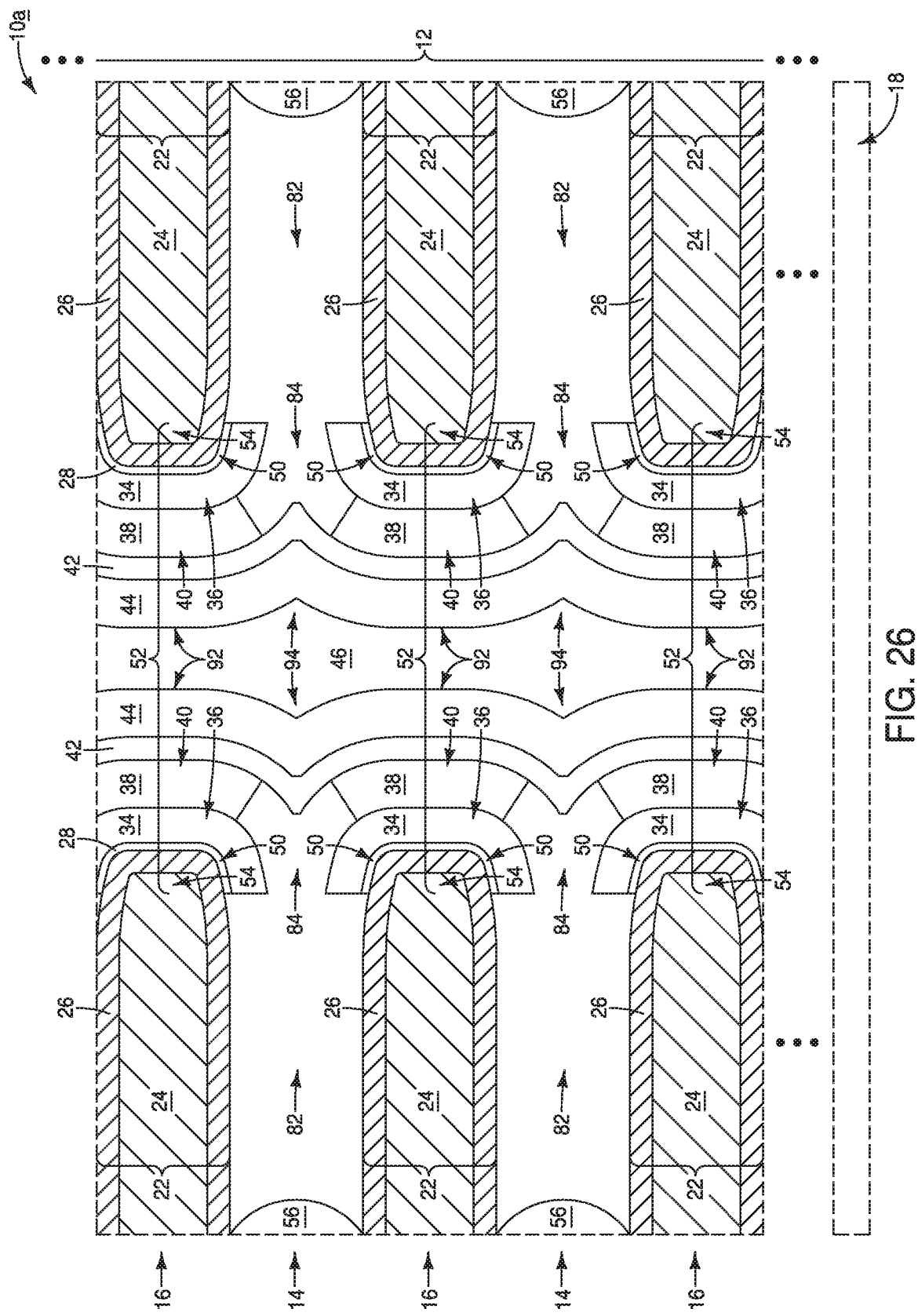
FIG. 26 is a diagrammatic cross-sectional side view of an integrated assembly showing a region of an example NAND memory array.

FIGS. 25 and 26 show the assembly 10a in configurations analogous to those described above with reference to FIGS. 19 and 20; and specifically show that the insulative material 56 may only partially fill the insulative levels 14 to leave voids (82, 86) remaining within such insulative levels.

In operation, the charge-storage material 38 may be configured to store information in the NAND memory cells 52 of the various embodiments described herein. The value (with the term "value" representing one bit or multiple bits) of information stored in an individual memory cell may be based on the amount of charge (e.g., the number of electrons) stored in a charge-storage region of the memory cell. The amount of charge within an individual charge-storage region may be controlled (e.g., increased or decreased), at least in part, based on the value of voltage applied to an associated gate 54, and/or based on the value of voltage applied to the channel material 44.

The tunneling material 42 forms tunneling regions of the memory cells 52. Such tunneling regions may be configured to allow desired migration (e.g., transportation) of charge (e.g., electrons) between the charge-storage material 38 and the channel material 44. The tunneling regions may be configured (i.e., engineered) to achieve a selected criterion, such as, for example, but not limited to, an equivalent oxide thickness (EOT). The EOT quantifies the electrical properties of the tunneling regions (e.g., capacitance) in terms of a representative physical thickness. For example, BOT may be defined as the thickness of a theoretical silicon dioxide layer that would be required to have the same capacitance density as a given dielectric, ignoring leakage current and reliability considerations.

The charge-blocking material 34 adjacent the charge-storage material 38 may provide a mechanism to block charge from flowing from the charge-storage material 38 to the associated gates 54.

The dielectric-barrier material (high-k material) 28 provided between the charge-blocking material 34 and the associated gates 54 may be utilized to inhibit back-tunneling of charge carriers from the gates 54 toward the charge-storage material 38. In some embodiments, the dielectric-barrier material 28 may be considered to form dielectric-barrier regions within the memory cells 52.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated structure having a vertical stack of alternating insulative levels and conductive levels. The conductive levels have terminal regions, and have nonterminal regions proximate the terminal regions. The terminal regions have top surfaces, bottom surfaces, and vertical-extending sidewall surfaces between the top surfaces and the bottom surfaces. High-k dielectric material is configured as caps wrapping around the terminal regions. The caps extend along the top surfaces, bottom surfaces and vertical surfaces of the terminal regions, and are not along the nonterminal regions. Charge-blocking material is arranged in vertically-stacked first segments. The first segments are adjacent to the caps. The first segments are vertically spaced from one another by gaps. Charge-storage material is arranged in vertically-stacked second segments. The second segments are adjacent to the first segments. The second segments are vertically spaced from one another by the gaps. Gate-dielectric material is adjacent to the charge-storage material. Channel material is adjacent to the gate-dielectric material.

Some embodiments include a NAND memory array having a vertical stack of alternating insulative levels and conductive levels. The conductive levels include control gate regions, and second regions proximate the control gate regions. High-k dielectric material wraps around ends of the control gate regions, and is not along the second regions. Charge-blocking material is adjacent to the high-k dielectric material. Charge-storage material is adjacent to the charge-blocking material. The charge-storage material is configured as segments which are vertically-stacked one atop another, and which are vertically spaced from one another by gaps. Gate-dielectric material is adjacent to the charge-storage material. Channel material extends vertically along the stack and is adjacent to the gate-dielectric material.

Some embodiments include a method of forming an integrated structure. A vertical stack of alternating first and second levels is formed. The first levels comprise first material, and the second levels comprise second material. An opening is formed to extend through the stack. The first levels are recessed relative to the second levels. The second levels have terminal ends which extend beyond the recessed first levels. The terminal ends have surfaces of the second material. The recessed first levels have surfaces of the first material. The surfaces of the first and second materials form an undulating sidewall surface of the opening. High-k dielectric material is formed along the undulating sidewall surface. The high-k dielectric material wraps around the terminal ends. The high-k dielectric material has first portions along the surfaces of the first material, and has second portions along the surfaces of the second material. Charge-blocking material is formed adjacent the high-k dielectric material. Charge-storage material is formed adjacent the charge-blocking material. Gate-dielectric material is formed adjacent the charge-storage material. Channel material is formed adjacent the gate-dielectric material. The second material is removed to leave first voids. Conductive levels are formed within the first voids. The conductive levels have terminal regions adjacent the high-k dielectric material, and have nonterminal regions proximate the terminal regions. The high-k dielectric material wraps around the terminal regions and is not along the nonterminal regions. The first material is removed together with the first portions of the high-k dielectric material, and with regions of the charge-blocking material, to leave second voids. The second voids are extended through the charge-storage material to divide the charge-storage material into vertically-spaced segments.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated structure, comprising:
   a vertical stack of alternating insulative levels and conductive levels;
   the conductive levels having terminal regions, and having nonterminal regions proximate the terminal regions; the terminal regions having top surfaces and bottom surfaces, and having vertically-extending sidewall surfaces between the top surfaces and the bottom surfaces;
   high-k dielectric material configured as caps wrapping around the terminal regions; the caps extending along the top surfaces, the bottom surfaces and the sidewall surfaces of the terminal regions, and not being along the nonterminal regions, the high-k dielectric material being directly against conductive material of the conductive levels along the top surfaces, bottom surfaces and sidewall surfaces of the terminal regions;
   a charge-blocking material arranged in vertically-stacked first segments, the charge-blocking material differing from the high-k dielectric material and comprising one or both of silicon oxynitride and silicon oxide; the first segments being adjacent the caps; the first segments being vertically spaced from one another by gaps;
   charge-storage material arranged in vertically-stacked second segments; the second segments being adjacent the first segments; the second segments being vertically spaced from one another by the gaps;
   gate-dielectric material adjacent the charge-storage material; and
   channel material adjacent the gate-dielectric material.

2. The integrated structure of claim 1 wherein the first segments wrap around the terminal regions.

3. The integrated structure of claim 2 wherein the first segments only partially overlap the caps along the top and bottom surfaces of the terminal regions.

4. The integrated structure of claim 1 wherein each of the caps has a substantially uniform thickness along its entire length.

5. The integrated structure of claim 4 wherein the substantially uniform thickness is within a range of from about 1 nm to about 5 nm.

6. The integrated structure of claim 1 wherein the high-k dielectric material comprises one or more of aluminum oxide, hafnium oxide, hafnium silicate, zirconium oxide and zirconium silicate.

7. The integrated structure of claim 1 wherein each of the second segments has a substantially flat configuration.

8. The integrated structure of claim 1 wherein each of the second segments has a substantially rounded configuration.

9. The integrated structure of claim 8 wherein the channel material extends vertically along the stack and undulates between peak regions along the second segments, and valley regions along the gaps between the second segments.

10. A NAND memory array, comprising:
    a vertical stack of alternating insulative levels and conductive levels;
    the conductive levels including control gate regions and second regions proximate the control gate regions;
    high-k dielectric material wrapping around ends of the control gate regions, and not being along said second regions, the high-k dielectric material being directly against conductive material of the control gate regions;
    charge-blocking material adjacent the high-k dielectric material, the charge-blocking material differing from the high-k dielectric material and comprising one or both of silicon oxynitride and silicon oxide;
    charge-storage material adjacent the charge-blocking material; the charge-storage material being configured as segments which are vertically-stacked one atop another, and which are vertically spaced from one another by gaps;
    gate-dielectric material adjacent the charge-storage material; and
    channel material extending vertically along the stack and being adjacent the gate-dielectric material.

11. The NAND memory array of claim 10 wherein the gaps are filled with insulative material.

12. The NAND memory array of claim 11 wherein the insulative material comprises silicon dioxide.

13. The NAND memory array of claim 10 wherein the insulative levels are at least partially filled with insulative material.

14. The NAND memory array of claim 13 wherein the insulative levels are only partially filled with the insulative material.

15. The NAND memory array of claim 13 wherein the insulative levels are entirely filled with the insulative material.

16. The NAND memory array of claim 13 wherein regions of the insulative material extend into the gaps, and wherein voids are within said regions of the insulative material.

17. The NAND memory array of claim 10 wherein the charge-storage material segments are second segments; and wherein the charge-blocking material is configured as first segments which are vertically-stacked one atop another, and which are spaced from one another by the gaps.

18. The NAND memory array of claim 17 wherein the first segments of the charge-blocking material wrap around the ends of the control gate regions.

19. The NAND memory array of claim 18 wherein the first segments of the charge-blocking material only partially overlap the high-k dielectric material along the ends of the control gate regions.

20. A method of forming an integrated structure, comprising:
    forming a vertical stack of alternating first and second levels; the first levels comprising first material and the second levels comprising second material;
    forming an opening to extend through the stack;
    recessing the first levels relative to the second levels; the second levels having terminal ends extending beyond the recessed first levels; the terminal ends having surfaces of the second material; the recessed first levels having surfaces of the first material; the surfaces of the first and second materials forming an undulating sidewall surface of the opening;
    forming high-k dielectric material along the undulating sidewall surface; the high-k dielectric material wrapping around the terminal ends; the high-k dielectric material having first portions along the surfaces of the first material, and having second portions along the surfaces of the second material;
    forming charge-blocking material adjacent the high-k dielectric material;

forming charge-storage material adjacent the charge-blocking material;

forming gate-dielectric material adjacent the charge-storage material;

forming channel material adjacent the gate-dielectric material;

removing the second material to leave first voids;

forming conductive levels within the first voids; the conductive levels having terminal regions adjacent the high-k dielectric material, and having nonterminal regions proximate the terminal regions; the high-k dielectric material wrapping around the terminal regions and not being along the nonterminal regions;

removing the first material, the first portions of the high-k dielectric material, and regions of the charge-blocking material to leave second voids; and extending the second voids through the charge-storage material to divide the charge-storage material into vertically-spaced segments.

21. The method of claim 20 further comprising rounding the terminal ends prior to forming the high-k dielectric material along the undulating sidewall surface.

22. The method of claim 20 wherein the terminal ends have substantially square corners, and wherein the high-k dielectric material is formed to extend around said substantially square corners.

23. The method of claim 20 further comprising partially filling the second voids with insulative material to leave portions of the second voids along the first levels, with said portions being capped by the insulative material.

24. The method of claim 20 further comprising filling the second voids with insulative material.

25. The method of claim 20 wherein each of the vertically-spaced segments has a substantially flat configuration.

26. The method of claim 20 wherein each of the vertically-spaced segments has a substantially rounded configuration.

27. The method of claim 20 wherein the high-k dielectric material has a substantially uniform thickness.

28. The method of claim 20 wherein the conductive levels formed within the first voids comprise two or more conductive materials.

29. The method of claim 28 wherein the high-k dielectric material is directly against one of said two or more conductive materials.

30. The method of claim 20 wherein NAND memory cells comprise control gates within the terminal regions.

\* \* \* \* \*